(12) United States Patent
Akiba et al.

(10) Patent No.: US 7,995,417 B2
(45) Date of Patent: *Aug. 9, 2011

(54) SEMICONDUCTOR MEMORY CIRCUIT

(75) Inventors: Takesada Akiba, Hachioji (JP); Shigeld Ueda, Hachioji (JP); Toshikazu Tachibana, Tachikawa (JP); Masashi Horiguchi, Koganel (JP)

(73) Assignees: Renesas Electronics Corporation, Kanagawa (JP); Hitachi Device Engineering Co., Ltd., Chiba-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/923,338

(22) Filed: Sep. 15, 2010

(65) Prior Publication Data

US 2011/0032777 A1    Feb. 10, 2011

Related U.S. Application Data

(63) Continuation of application No. 11/902,877, filed on Sep. 26, 2007, now Pat. No. 7,821,862, which is a continuation of application No. 11/472,252, filed on Jun. 22, 2006, now Pat. No. 7,292,496, which is a continuation of application No. 11/174,604, filed on Jul. 6, 2005, now Pat. No. 7,088,636, which is a continuation of application No. 10/190,480, filed on Jul. 9, 2002, now Pat. No. 6,934,210.

(30) Foreign Application Priority Data

Aug. 30, 2001  (JP) ................................. 2001-261123

(51) Int. Cl.
*G11C 5/14*  (2006.01)
*G11C 8/00*  (2006.01)

(52) U.S. Cl. ........ 365/226; 365/227; 365/228; 365/229; 365/230.06

(58) Field of Classification Search .................. 365/226, 365/227, 228, 229, 230.06
See application file for complete search history.

(56) References Cited

U.S. PATENT DOCUMENTS 5,272,676 A    12/1993    Kubono et al.
5,278,797 A    1/1994    Jeon et al.
(Continued)

FOREIGN PATENT DOCUMENTS

EP    1 100 089 A1    5/2001
(Continued)

OTHER PUBLICATIONS

Office Action from the Japanese Patent Office of Japanese Application No. 2001-261123 dated Jun. 11, 2008, and translation+.

*Primary Examiner* — Trong Phan
(74) *Attorney, Agent, or Firm* — Stites & Harbison, PLLC; Juan Carlos A. Marquez, Esq.

(57) ABSTRACT

The present invention provides a semiconductor memory circuit capable of reducing current consumption at non-operation in a system equipped with a plurality of chips that share the use of a power supply, address signals and a data bus. The semiconductor memory circuit has an internal circuit which is capable of selectively performing the supply and stop of an operating voltage via switch means and includes a memory array. An input circuit, which receives a predetermined control signal therein, controls the supply and stop of the operating voltage by the switch means to reduce a DC current and a leak current when no memory operation is done, whereby low power consumption can be realized.

3 Claims, 34 Drawing Sheets

U.S. PATENT DOCUMENTS

| | | |
|---|---|---|
| 5,375,093 A | 12/1994 | Hirano |
| 5,495,452 A | 2/1996 | Cha |
| 5,532,968 A | 7/1996 | Lee |
| 5,544,120 A | 8/1996 | Kuwagata et al. |
| 5,652,729 A | 7/1997 | Iwata et al. |
| 5,874,853 A | 2/1999 | Yamaguchi et al. |
| 6,304,148 B1 | 10/2001 | Nomura et al. |
| 6,510,096 B2 | 1/2003 | Choi et al. |
| 6,512,715 B2 | 1/2003 | Okamoto et al. |
| 6,515,928 B2 | 2/2003 | Sato et al. |
| 6,563,746 B2 | 5/2003 | Fujioka et al. |
| 6,584,032 B2 | 6/2003 | Fujioka et al. |
| 6,721,223 B2 | 4/2004 | Matsumoto et al. |

FOREIGN PATENT DOCUMENTS

| | | |
|---|---|---|
| JP | 61-71494 | 4/1986 |
| JP | 61-202395 | 9/1986 |
| JP | 3-46190 | 2/1991 |
| JP | 3-207084 | 9/1991 |
| JP | 4-192178 | 7/1992 |
| JP | 4-195890 | 7/1992 |
| JP | 5-54648 | 3/1993 |
| JP | 5-120870 | 5/1993 |
| JP | 5-189964 | 7/1993 |
| JP | 5-274887 | 10/1993 |
| JP | 5-307882 | 11/1993 |
| JP | 5-342865 | 12/1993 |
| JP | 6-150647 | 5/1994 |
| JP | 7-41797 | 2/1995 |
| JP | 08-148576 | 6/1996 |
| JP | 10-188560 | 7/1998 |
| JP | 2000-30440 | 1/2000 |
| JP | 2000-163955 | 6/2000 |

SEMICONDUCTOR MEMORY CIRCUIT

CROSS REFERENCE TO RELATED APPLICATIONS

This application is a Continuation application of U.S. application Ser. No. 11/092,877 filed Sep. 26, 2007, issued as U.S. Pat. No. 7,821,862 on Oct. 26, 2010, which is a Continuation application of U.S. application Ser. No. 11/472,252 filed Jun. 22, 2006, issued as U.S. Pat. No. 7,292,496 on Nov. 6, 2007, which is a Continuation of U.S. application Ser. No. 11/174,604 filed Jul. 6, 2005 issued as U.S. Pat. No. 7,088,636 on Aug. 8, 2006,which is a Continuation application of U.S. application Ser. No. 10/190,480 filed on Jul. 9, 2002, issued as U.S. Pat. No. 6,934,210 on Aug. 23, 2005. Priority is claimed based upon U.S. application Ser. No. 11/902,877 filed Sep. 26, 2007, which claims priority of U.S. application Ser. No. 11/472,252 filed Jun. 22, 2006, which claims priority of U.S. application Ser. No. 11/174,604 filed Jul. 6, 2005, which claims the priority of U.S. application Ser. No. 10/190, 480 filed on Jul. 9, 2002, which claims the priority date of Japanese Application No. 2001-261123 filed on Aug. 30, 2001, all of which is hereby incorporated by reference.

BACKGROUND OF THE INVENTION

The present invention relates mainly to a semiconductor memory circuit which needs a refresh operation, and to a technology effective for application to a pseudo static RAM or the like usable equally to a static RAM. (Random Access Memory) equivalently.

A so-called DRAM of a time multiplex system wherein in order to make it possible to cope with a DRAM in a manner similar to an SRAM (Static Random Access Memory), a read/write operation and a refresh operation are executed during one cycle with their times being allocated therefor, or the two operations are performed only when the read/write operation and the refresh operation compete with each other, has been proposed in Unexamined Patent Publication No. Sho 61 (1986)-71494.

SUMMARY OF THE INVENTION

In the DRAM including the time multiplex system referred to above, a DC current in an internal power supply circuit mounted in a chip, and a refresh current for data retention are consumed even when the chip is non-operated (at standby) in a state in which an external power supply VDD is being applied. Further, an off current of each MOSFET is used up or consumed even in a state in which a CMOS logic circuit constituting a peripheral circuit is deactivated. This off current results from a subthreshold characteristic of the MOSFET. Even if a gate voltage is off at 0V in the case of an N channel MOSFET, for example, a small off current flows between its drain and source. In the case of a DRAM having memory capacity like about 32M (Mega) bits, for example, an off current at its entirety is innegligible.

When a DRAM chip is mounted to a system, other memory chips (e.g., ROM, etc.) and power supplies VDD and VSS, and external signals (address signal Ai and data bus DQ) are shared. Even when the DRAM chip is deactivated (at standby) in this case, it is necessary to apply the power supplies VDD and VSS for the purpose of a memory access to a ROM chip. Thus, even when the DRAM chip is in the above-deactivated state, it continues to allow current consumption to flow uselessly.

For example, a DRAM used in a portable device or the like operated by battery driving needs a reduction in at-standby current in a broad temperature region. As the at-standby currents in the DRAM, may be mentioned, a DC current consumed by a power supply circuit or the like, the off current of each MOSFET, and the refresh operating current for data retention. Since the occupied rate of off current of these currents is large in the neighborhood of the maximum operation compensating temperature, the adoption or the like of an off-current cut MOSFET (cut MOSFET for measures against subthreshold leak) results in measures against the at-standby current reduction, which are effective in reducing the off current. On the other hand, since the off current is little produced in a lower temperature region, particularly in the vicinity of daily-used normal temperatures, the occupied rate of refresh current increases. However, such a conventional DRAM as described above does no disclose means effective in reducing the refresh current.

In a DRAM having complete compatibility with an SRAM, and a DRAM called a pseudo SRAM in the above DRAMs, refresh operations are respectively always performed by internal timers. Since these memories perform the refresh operations at all times even if they are at standby, the analysis of AC and DC current components of at-standby currents in cut and divided states becomes difficult. Since only a refresh operating current based on a cycle always determined by the internal timer is evaluated, this will do harm even to an analysis made with a view toward executing lower current consumption with the extension of a refresh cycle. Further, a problem arises in that since a refresh operation is automatically performed by an internal timer even upon evaluation of a data retention characteristic, a true data retention characteristic cannot be obtained.

An object of the present invention is to provide a semiconductor memory circuit capable of reducing current consumption at non-operation in a system equipped with a plurality of chips that share the use of a power supply, address signals and a data bus. Another object of the present invention is to provide a semiconductor memory circuit such as a DRAM or the like which has reduced an at-standby current by a reduction in refresh operating current in a lower temperature region, particularly in the neighborhood of daily-used normal temperatures. A further object of the present invention is to provide a semiconductor memory circuit such as a DRAM or the like capable of performing more accurate characteristic evaluation. The above, other objects and novel features of the present invention will become apparent from the description of the present specification and the accompanying drawings.

A summary of a typical one of the inventions disclosed in the present application will be described in brief as follows: In a memory circuit, switch means are respectively provided between VDD or VSS and a power supply circuit. The switch means are controlled by an internal signal produced from an external signal to cut current consumption of the power supply circuit at deactivation or non-operation of the memory circuit. The supply of internal voltages to their corresponding internal circuits, which are generated from the power supply circuit, is also stopped and hence leak currents thereat are also cut.

When the current consumption is cut, an output terminal of an output circuit is brought to high impedance to ensure the operations of other circuits on a system. In the memory circuit having a refresh timer, the refresh timer is also deactivated to stop a refresh operation.

In the memory circuit which performs a refresh operation, a data retention characteristic has temperature dependence. By paying attention to the fact that a characteristic in a low temperature region is enhanced, the internal refresh timer for data retention is caused to have temperature dependence and provided with a signal for forcedly stopping an internal refresh operation signal. Further, it is caused to have a function capable of externally controlling timing for the refresh operation.

DETAILED DESCRIPTION OF THE PREFERRED EMBODIMENTS

Preferred embodiments of the present invention will hereinafter be described in detail with reference to the accompanying drawings.

Figure 1:
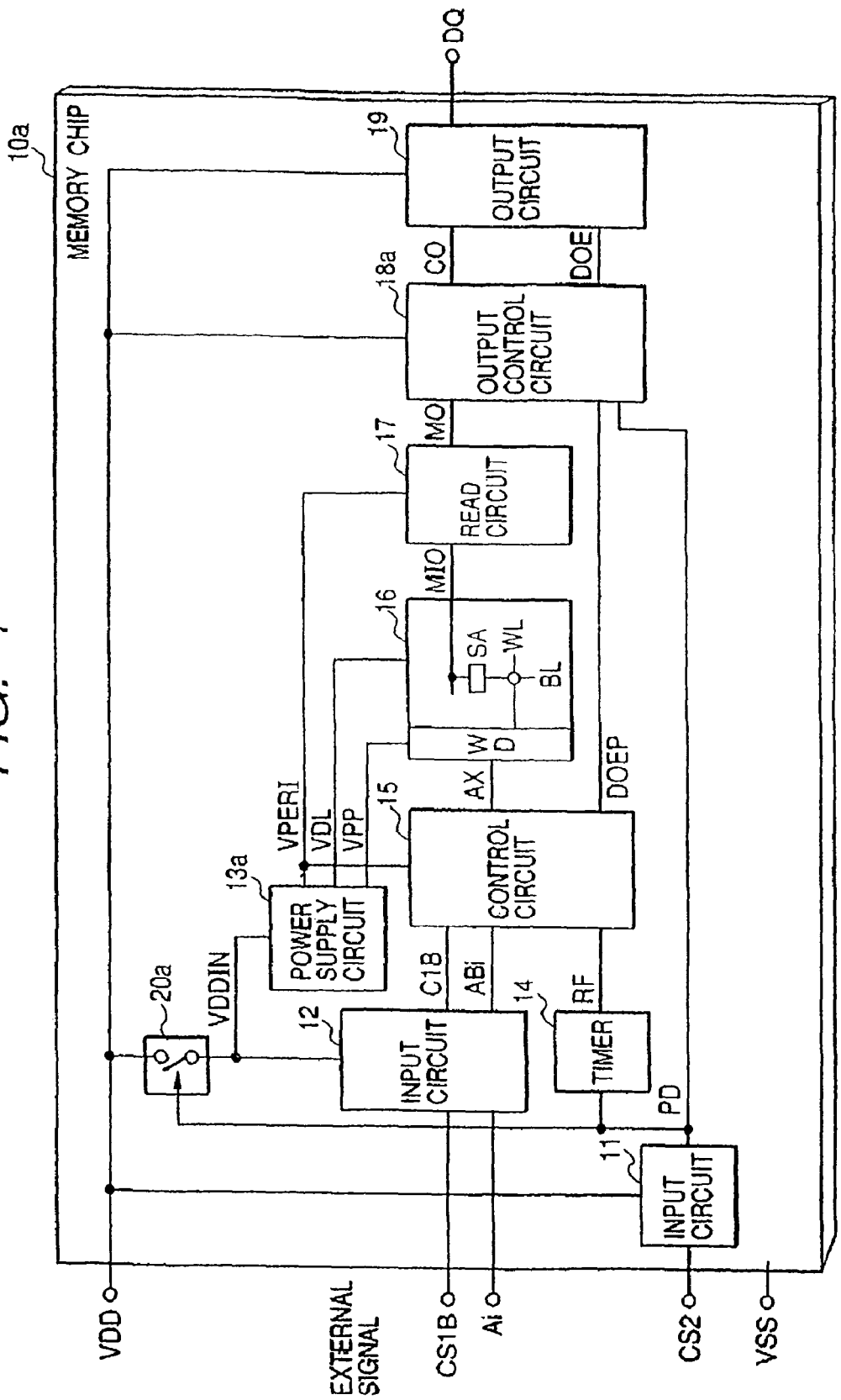
FIG. 1 is a block diagram showing one embodiment of a DRAM according to the present invention.

A block diagram of one embodiment of a DRAM according to the present invention is shown in FIG. 1. Respective circuit blocks that constitute a memory chip 10a according to this embodiment, are formed on a single semiconductor substrate like monocrystalline silicon by the known MOS integrated circuit manufacturing technology. Although not restricted in particular, the DRAM according to the present embodiment has an input/output interface corresponding to a static RAM to enable replacement with the static RAM.

In the present embodiment, a source or power supply voltage VDD supplied from an external terminal is used as an internal power supply voltage VDDIN via switch means 20a and supplied to an input circuit 12 and a power supply circuit 13a as an operating voltage. Although not restricted in particular, the switch means 20a is controlled based on a power-down signal PD produced from a control signal CS2 corresponding to a signal for giving instructions for a deep power-down mode (hereinafter called simply "DPD") in the static RAM. Namely, the signal CS2 inputted from the external terminal is inputted to the input circuit 11 brought into an operating state on a steady basis by the power supply voltage VDD supplied from the external terminal, after which the power-down signal PD is generated via the input circuit 11.

An internal voltage VPERI formed or produced by the power supply circuit 13a is supplied to a control circuit 15 and a read circuit 17, whereas a boost voltage VPP and a step-down voltage VDL are supplied to a memory array 16. An output MO of the read circuit 17 operated based on the internal voltage VPERI, and an output control signal DOEP formed by the control circuit 15 are inputted to an output circuit 19 via an output control circuit 18a. The output control circuit 18a is also controlled by the power-down signal PD.

The input circuit 11 is brought into the operating state on the steady basis by the power supply voltage VDD supplied from the external terminal as described above, whereas the read circuit 17 and the control circuit 15 are operated by the internal voltage VPERI generated by the power supply circuit 13a. The internal voltage VPERI is shut off or interrupted by an operation stop of the power supply circuit 13a, which corresponds to an off state of the switch means 20a. The output control circuit 18 is operated on a steady basis by the power supply voltage VDD supplied from the external terminal and prevents the operation of the output circuit 19 from being instabilized by undefined levels of the signals DOEP and MO respectively formed by the control circuit 15 and the read circuit 17 at which the power-off is done by the signal PD.

In the present embodiment, a timer 14 for refresh is also controlled by the power-down signal PD to reduce current consumption in the above DPD, thereby stopping a refresh operation in the deep power-down mode. Namely, since the respective operating voltages VPERI, VPP, VDL of the control circuit 15, read circuit 17 and memory array 16 are shut off, the refresh timer 14 is also deactivated because it is useless to operate it.

In the DRAM according to the present embodiment, the memory array 16 includes a plurality of memory cells which are provided in association with a plurality of bit lines BL and a plurality of word lines WL and each of which needs a refresh operation for periodically holding memory information. Each of the memory cells comprises an information storage capacitor and an address selection MOSFET, for example. The gate of the address selection MOSFET is connected to its corresponding word line. One of source and drain paths is connected to its corresponding bit line, whereas the other thereof is connected to its corresponding storage node of the storage capacitor.

The bit lines are provided in pair and connected to their corresponding input/output nodes of sense amplifiers SA each comprising a differential latch circuit. Each of the memory cells is connected to one of each bit line pair according to a word line selecting operation, and no memory cell is connected to the other thereof. The sense amplifier carries out rewriting (or refresh operation) of regarding a precharge voltage on the bit line to which no memory cell is connected, as a reference voltage, amplifying a small potential difference between the precharge voltage and a read signal read into the bit line to which each memory cell is connected, to a high level and a low level, and restoring the state of an electrical charge of each storage capacitor, which is likely to lose according to the word line selecting operation, to its original storage state. Such a configuration can make use of one identical to one for the dynamic RAM known to date.

The memory array 16 is provided with a word driver WD for selecting each word line WL and a column selection circuit for selecting each bit line BL. The boost voltage VPP is supplied to the word driver WD to increase the level of selecting the word line WL. The step-down voltage VDL is set as an operating voltage for the sense amplifier SA to define a high level stored in each memory cell. A differential voltage between the VDL and VPP is set so as to be identical to or slightly higher than an effective threshold voltage between the gate and source of the address selection MOSFET and enables full writing to the corresponding capacitor.

The input circuit 12 is an input circuit for receiving an address signal Ai and a chip select signal CS1B therein and supplies the input signal C1B and address signal ABi to the control circuit 15. Although not restricted in particular, the control circuit 15 includes an address transition detection circuit and generates timing signals or the like for row-system control and a column system.

In each of the dynamic memory cells referred to above, information charge stored in the corresponding capacitor will be lost with the elapse of time. Therefore, the dynamic memory cell needs the refresh operation of performing a read operation before such information charge is lost and restoring its state to the original state of charge. The timer 14 forms a predetermined time signal corresponding to information holding capacity of the memory cell. A signal RF outputted from the timer 14 is inputted to the control circuit 15 and used to execute refresh for an address specified by a refresh address counter.

In the DRAM of the present embodiment, although not restricted in particular, the control circuit 15 performs control for detecting the transition of an external row address signal, i.e., early one of a signal outputted from its row address transition detection circuit and a signal RF outputted from its internal refresh timer, executing either a normal memory access or a refresh operation and executing the non-executed operation after its execution. Thus, since there is no malfunction even if the internal refresh operation and the external access collide with each other, an external refresh request can be made unnecessary.

Figure 2:
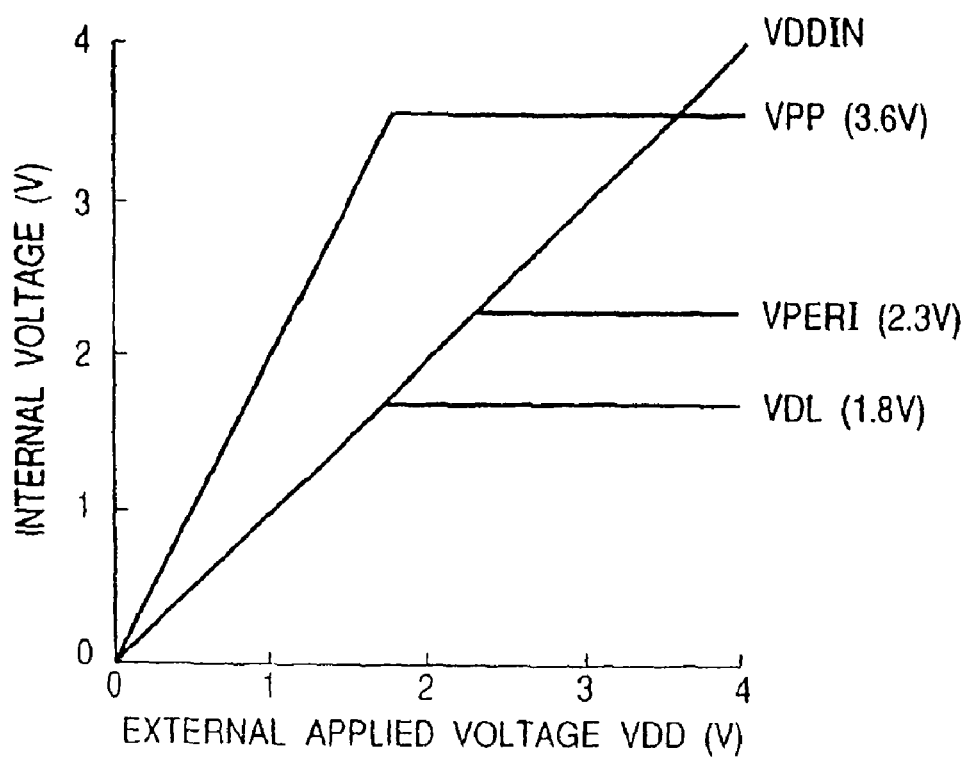
FIG. 2 is a characteristic diagram depicting one embodiment illustrative of internal voltages of power supply circuit shown in FIG. 1.

A characteristic diagram of one embodiment illustrative of internal voltages outputted from the power supply circuit shown in FIG. 1 is shown in FIG. 2. With respect to the internal voltage VDDIN corresponding to the power supply voltage VDD supplied from the external terminal, the internal step-down voltage VDL is stepped down to a constant voltage of 1.8V, and the internal voltage VPERI for the peripheral circuit is stepped down to a constant of 2.3V. The boost voltage VPP is boosted to 3.6V. Although not restricted in particular, the boost voltage VPP is stabilized by supplying the VPERI or VDL to a charge pump circuit and forming it thereat.

Figure 3:
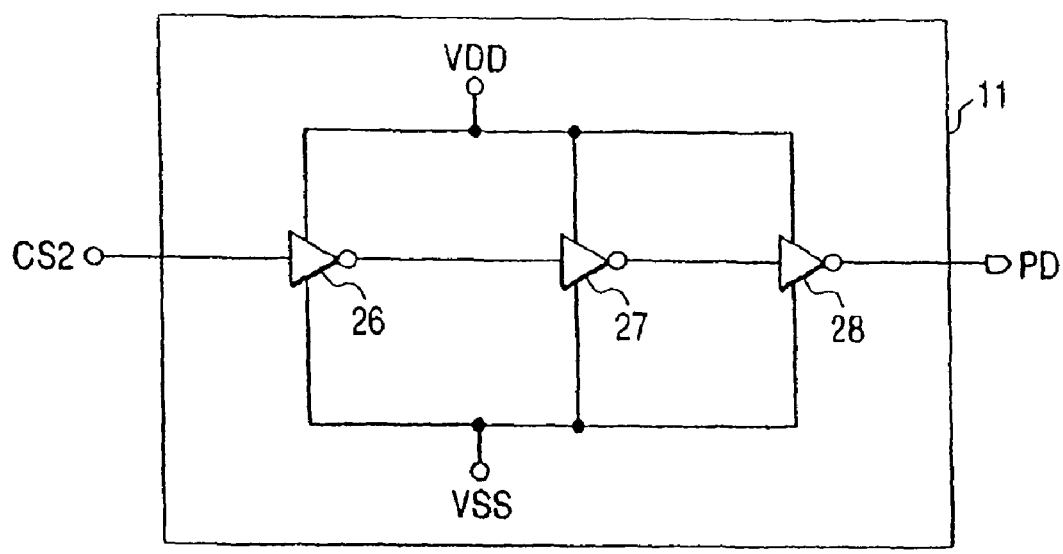
FIG. 3 is a circuit diagram showing one embodiment of an input circuit 11 shown in FIG. 1.

A circuit diagram of one embodiment of the input circuit 11 shown in FIG. 1 is shown in FIG. 3. The input circuit is used to receive a CS2 signal and comprises three-stage CMOS inverter circuits 26, 27 and 28 respectively brought to an operating state by the power supply voltage VDD supplied from the external terminal and a circuit's ground potential VSS. Since such operating voltages VDD and VSS are supplied on a steady basis, the input circuit is always operable and forms a power-down signal PD corresponding to a change in the signal CS2. In the present embodiment, the power-down signal PD is brought to an inverted signal of the external signal (chip select signal) CS2 by the three inverter circuits 26 through 28. However, the power-down signal PD is not limited to it. Such a signal as to be controlled by the external signal and turn off the switch means 20a in a DPD mode may be used.

Figure 4:
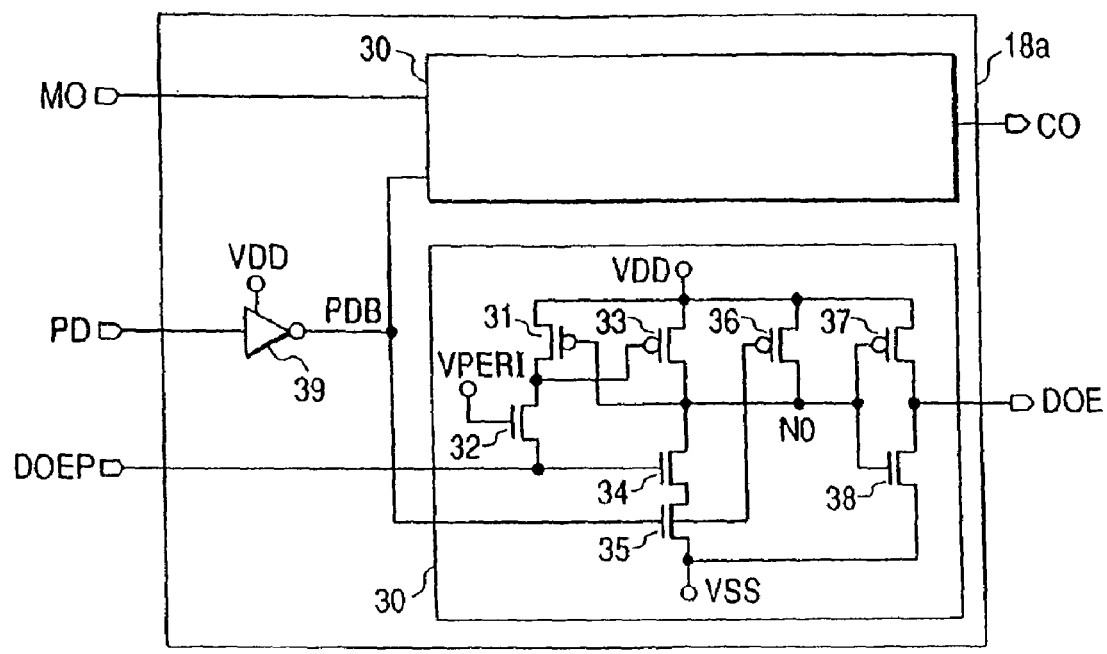
FIG. 4 is a circuit diagram illustrating one embodiment of an output control circuit 18a shown in FIG. 1.

A circuit diagram of one embodiment of the output control circuit 18a shown in FIG. 1 is shown in FIG. 4. Since each of input signals MO and DOEP inputted to the output control circuit 18a has signal amplitude corresponding to the above-described internal voltage VPERI, whereas an operating voltage of the output circuit 19 is given as the power supply voltage VDD as described above, a level converting circuit 30 is provided. The level converting circuit 30 converts signals MO and DOEP each having a VPERI level to signals CO and DOE each having a VDD level. A level conversion section corresponding to the input signal DOEP comprises P channel MOSFETs 31 and 33 provided in a latch form, an N channel MOSFET 32 provided between the drain of the MOSFET 31 and the input signal DOEP and having a gate to which VPERI is applied, and an N channel MOSFET 34 that receives the input signal DOEP therein. The level converting circuit 30 corresponding to the input signal MO is also similar to the above.

An inverter circuit 39 operated by the power supply voltage VDD forms a PDB signal obtained by inverting the power-down signal PD and controls an N channel MOSFET 35 and a P channel MOSFET 36 added to the level conversion section. Namely, the MOSFET 35 and the MOSFET 36 are respectively turned off and turned on in response to a low level of the signal PDB. Thus, an internal node NO is fixed to a high level without depending on the input signal DOEP, and DOE is fixed to a low level. Further, an output DQ of a chip is brought to high impedance. In the DPD mode referred to above, a DC current is cut off by the off-state of the MOSFET 35 so that the level converting circuit 30 is brought to low consumption power.

Figure 5:
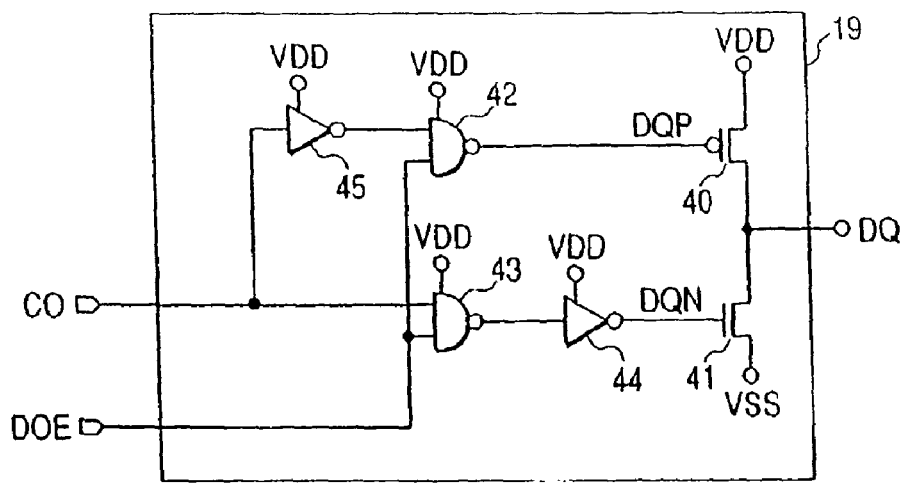
FIG. 5 is a circuit diagram showing one embodiment of an output circuit 19 shown in FIG. 1.

A circuit diagram of one embodiment of the output circuit 19 shown in FIG. 1 is shown in FIG. 5. In the output circuit employed in the present embodiment, NAND gate circuits 42 and 43 and an inverter circuit 44 controlled by the output control signal DOE control a P channel output MOSFET 40 and an N channel output MOSFET 41. A data signal CO and an inverted signal formed by the inverter circuit 45 are respectively supplied to the other inputs of the gate circuits 43 and 42. When the output control signal DOE is low in level, a drive signal DQP is brought to a high level and a drive signal DQN is brought to a low level. Thus, the output MOSFETs 40 and 41 are both brought to an off state regardless of the level of the data signal CO so that the output DQ is brought to high impedance. When the data signal CO is set as a pair of differential signals by the output control circuit 18a, the inverter circuit 15 becomes unnecessary and a bar signal (inverted signal) may be inputted to the NAND gate circuit 42.

Figure 6:
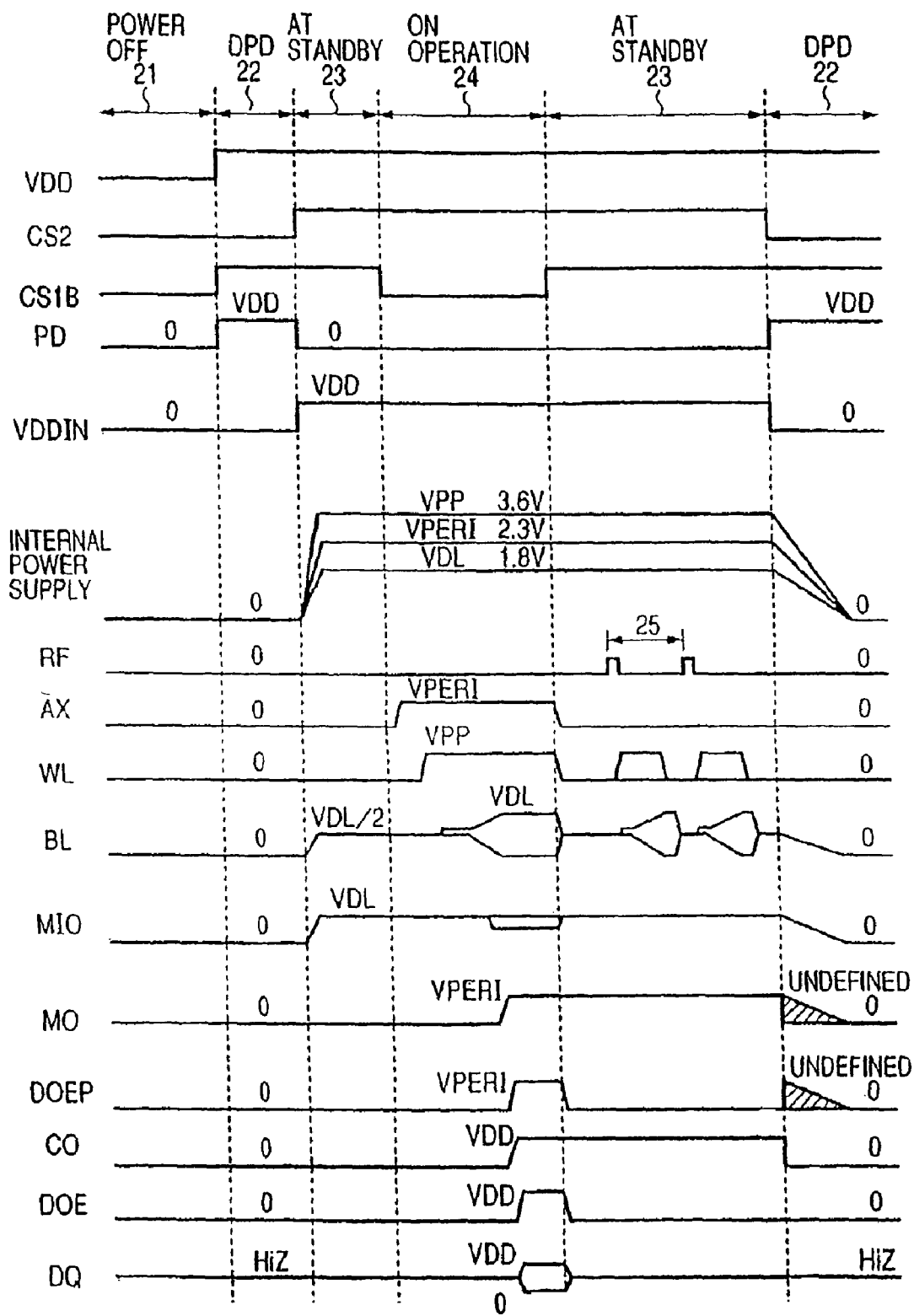
FIG. 6 is an operation waveform diagram for describing one example of the operation of the DRAM shown in FIG. 1.

An operation waveform diagram for describing one example of the operation of the DRAM shown in FIG. 1 is shown in FIG. 6. A DRAM chip 10a has four types of states of power off, DPD (deep power-down), standby, and an operation according to the power supply voltage VDD and signals CS2 and CS1B.

When the signal CS is low in level in a state in which the power supply voltage VDD is applied, the DRAM is brought to a DPD mode 22. At this time, the power-down signal PD results in a high level and the switch means 20a is turned off so that VDDIN is brought to a low level (0V). Thus, the input circuit 12 and the power supply circuit 13a are power-off so that their circuit operations are stopped. With such deactivation of the power supply circuit 13a, all of the internal power supply voltages VPERI, VPP and VDL are brought to the low level (0V). Consequently, each of the power supply circuit 13a, input circuit 12, control circuit 15, memory array 16 and read circuit 17 assumes a current consumption of 0. The timer 14 is also deactivated by the PD signal and hence a refresh operating current also results in 0. Further, the activation signal DOE for the output circuit becomes low in level by the PD signal in the output control circuit 18a, so that the output DQ is brought to high impedance.

When the CS2 is taken high in level in the state in which the power supply voltage VDD is applied, the DRAM is brought to a standby state 23. The power-down signal PD becomes low in level and the switch means 20a is turned on so that the internal power supply voltage VDDIN is brought to a high level. Thus, the power supply circuit 13a is brought to an operating state to generate predetermined voltages VPERI, VPP and VDL. Incidentally, the timer 14 is operated during this standby period to output an RF signal for each predetermined period 25, whereby a refresh operation is performed so as to hold data for the memory array 16.

When the CS2 is taken high in level and the CSLB is taken low in level in the state in which the power supply voltage VDD is applied, the DRAM is brought to an on-operation 24 so that the corresponding memory array 16 is selected according to the external address signal Ai, whereby data is read as MO. Based on the control signal DOEP, the output circuit is activated to output DQ. Since the external power supply voltage VDD per se is shut off in a power-off state 21, all the circuits are deactivated.

Figure 7:
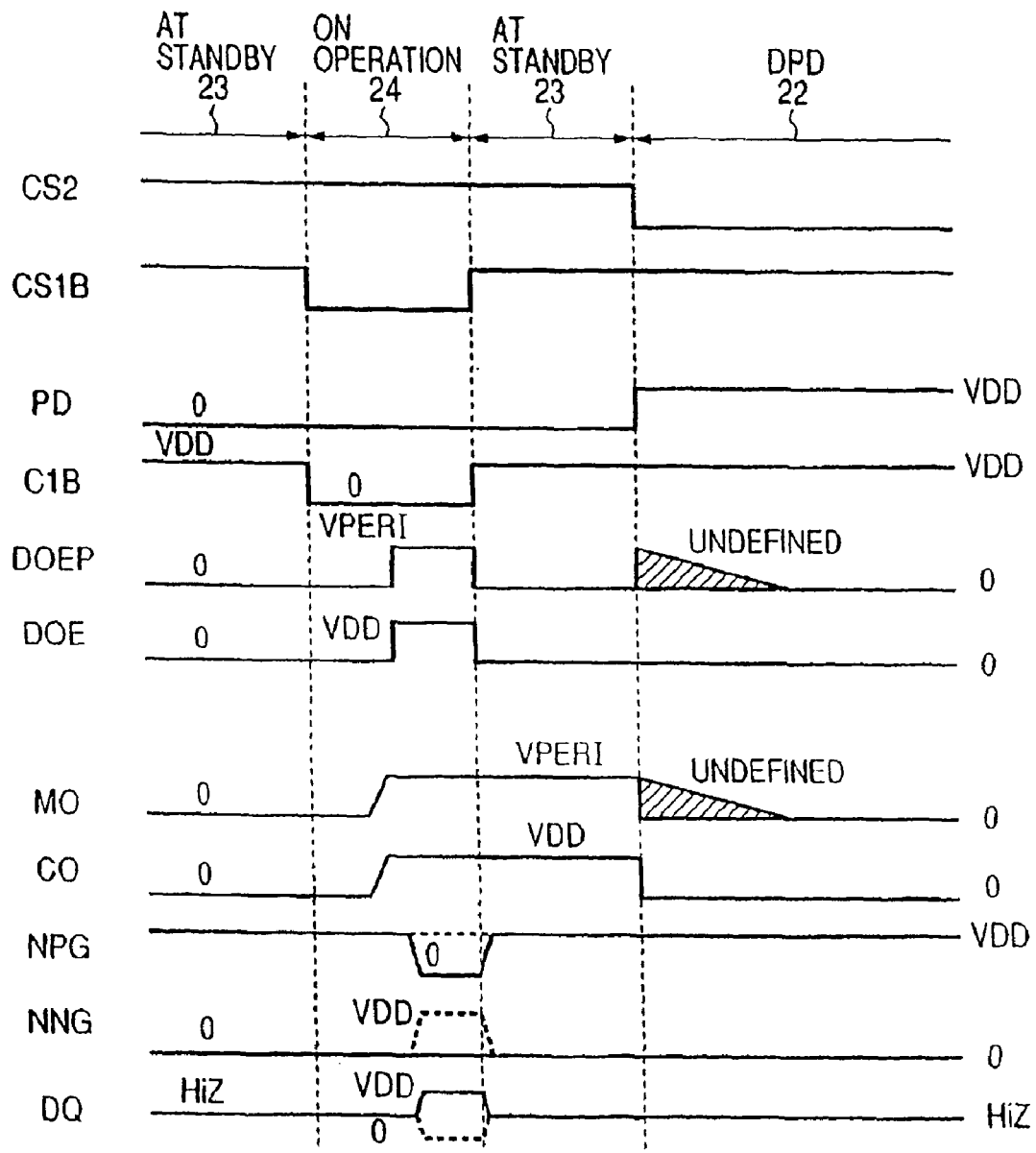
FIG. 7 is an operation waveform diagram for describing one example illustrative of operations of the output control circuit shown in FIG. 4 and the output circuit shown in FIG. 5.

An operation waveform diagram for describing one example illustrative of the output control circuit shown in FIG. 4 and the output circuit shown in FIG. 5 is shown in FIG. 7. At standby, DOE is low in level and an output DQ is brought to high impedance. Upon operation, DOE becomes high in level according to DOEP, and the output DQ is outputted according to read data signals MO and CO. Upon DPD, a PD signal is brought to a high level, and DOE is taken low in level regardless of DOEP and MO even if internal power supply voltages are stopped and DOEP and MO are taken undefined. Thus, the output DQ is brought to the high impedance.

Figure 8:
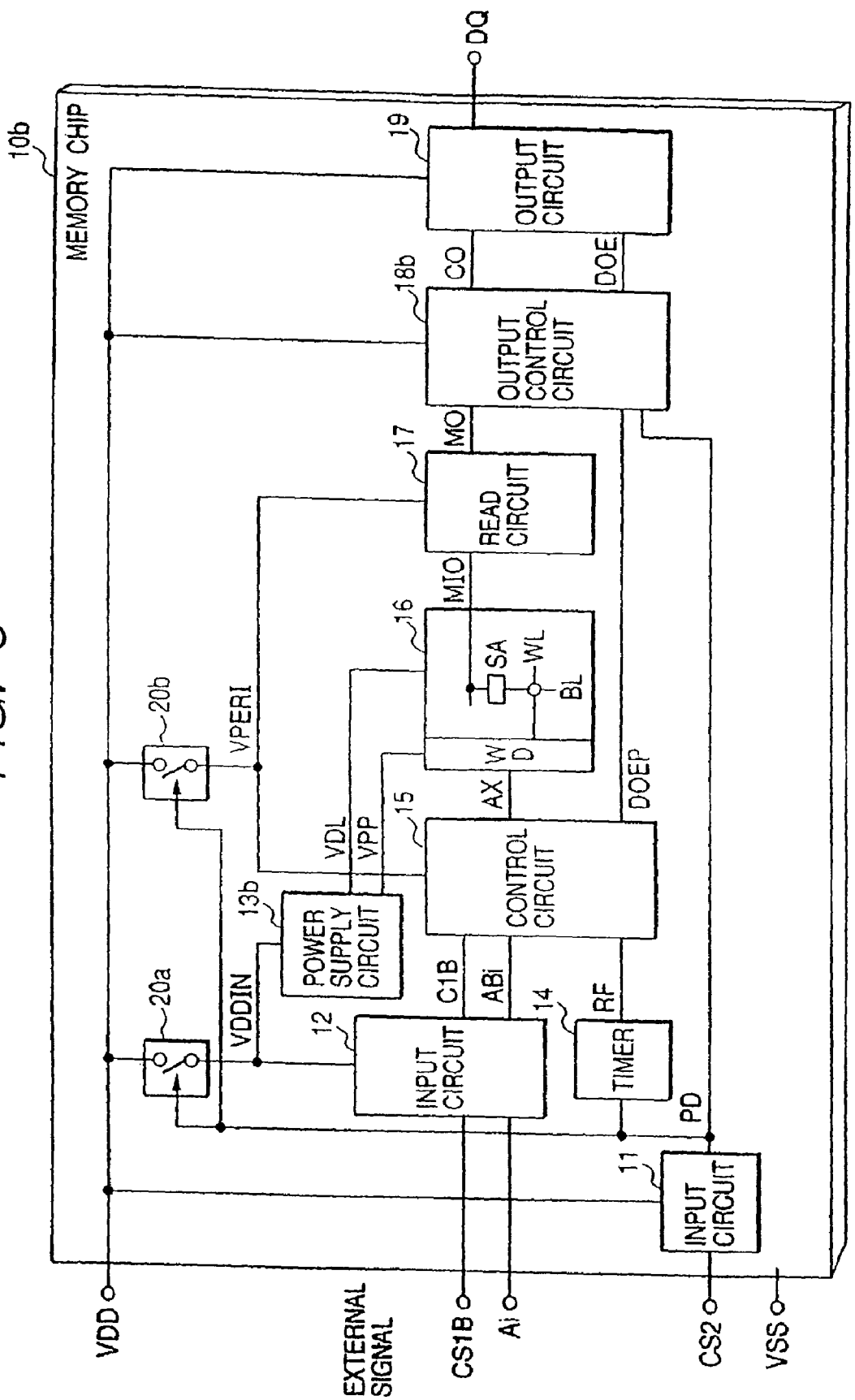
FIG. 8 is a block diagram illustrating another embodiment of a DRAM according to the present invention.

A block diagram of another embodiment of a DRAM according to the present invention is shown in FIG. 8. In the present embodiment, VDD is indented for a case in which it is used as low as about 2.5V. Therefore, the present embodiment is different from the embodiment shown in FIG. 1 in that an operating voltage supplied to each peripheral circuit is set so as to be equal to VDD. Therefore, switch means 20b is added to a control circuit 15 and a read circuit 17, and a power supply voltage VDD supplied from outside via such switch means 20b is supplied to the respective circuits 15 and 17 as an internal voltage VPERI.

In response to the above setting of the operating voltage, a power supply circuit 13b generates only an internal step-down voltage VDL and a boost voltage VPP. Since VPERI is set to a low level upon DPD to reduce a leak current even in the case of this embodiment, the switch means 20b is necessary. Thus, the switches 20a and 20b are controlled in the same manner as described above according to a power-down signal PD formed by their corresponding input circuit 11. The present embodiment is identical in other configuration to the embodiment shown in FIG. 1 as well as in operation and is capable of obtaining similar effects.

Figure 9:
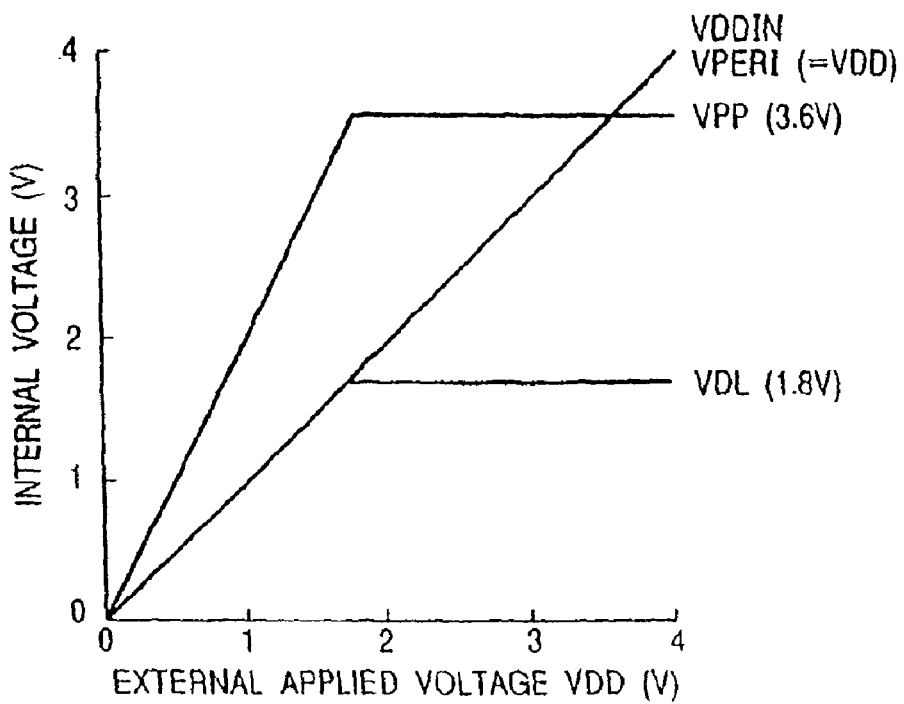
FIG. 9 is a characteristic diagram showing one embodiment of an internal voltage of a power supply circuit shown in FIG. 8.

A characteristic diagram of one embodiment illustrative of internal voltages produced from the power supply circuit shown in FIG. 8 is shown in FIG. 9. The reference label VDDIN indicates an internal voltage, and the reference label VPERI indicates an internal voltage. In the present embodiment, VPERI=VDD. VDL and VPP are similar to those shown in FIG. 8. Namely, the operating voltage VPERI for each peripheral circuit is set to the same in association with the power supply voltage VDD supplied from an external terminal, an internal step-down voltage VDL is boosted to 1.8V, and a boost voltage VPP is boosted to 3.6V.

Figure 10:
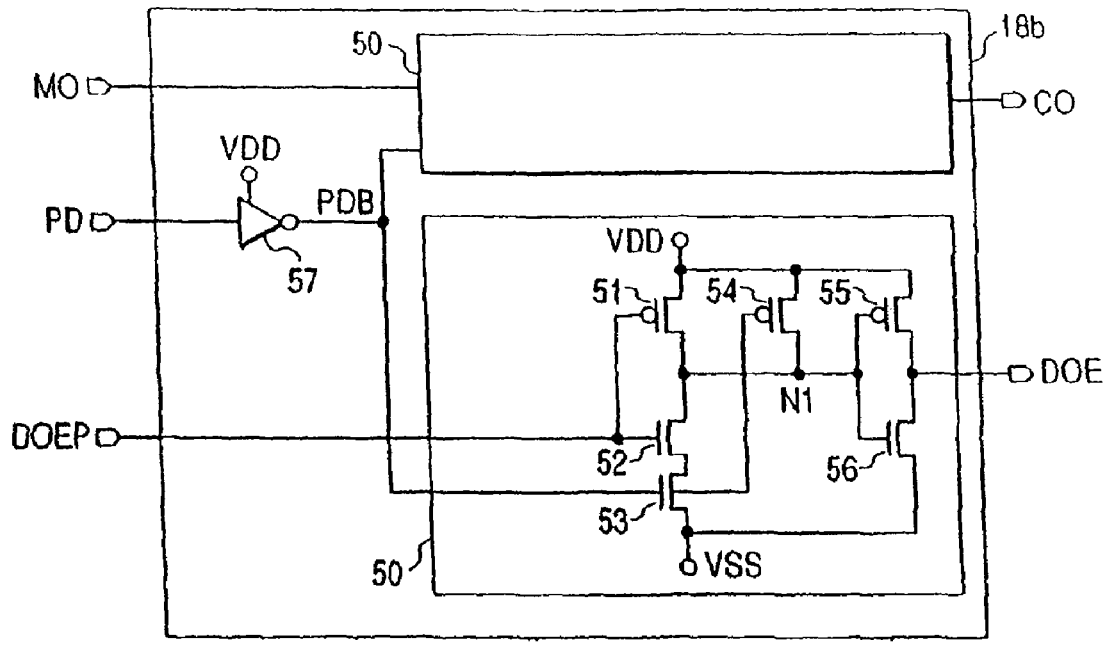
FIG. 10 is a circuit diagram showing one embodiment of an output control circuit 18b shown in FIG. 8.

A circuit diagram of one embodiment of an output control circuit 18b shown in FIG. 8 is shown in FIG. 10. Since VPERI=VDD upon standby and operation in the present embodiment, level conversion becomes unnecessary. Thus, the level converting function shown in FIG. 4 is omitted and a logic circuit 50 forms a buffer circuit in which a P channel MOSFET 51 and an N channel MOSFET 52 receive a signal DOEP. An N channel MOSFET 53 and a P channel MOSFET 54 controlled by a signal PDB are provided in a manner similar to the circuit shown in FIG. 4. Namely, the logic circuit constitutes a NAND gate circuit comprising the MOS-FETs 51, 52, 53 and 54 and is supplied with the signals DOEP and PD. A signal outputted therefrom is outputted as a signal DOE via an inverter circuit which comprises MOSFETs 55 and 56. A logic circuit 50 corresponding to an input signal MO is similar to the above.

Figure 11:
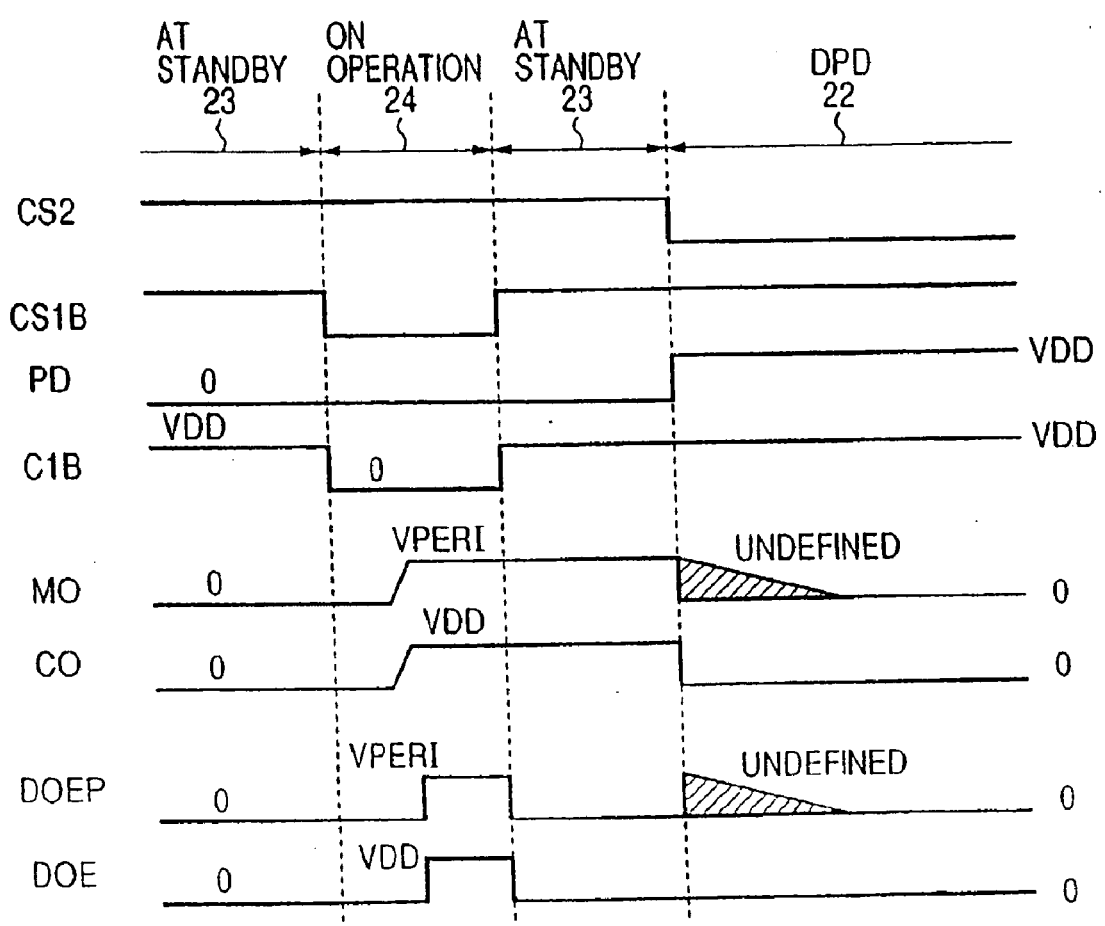
FIG. 11 is an operation waveform diagram for describing one example of the operation of the output control circuit 18b shown in FIG. 10.

An operation waveform diagram for describing one example of the operation of the output control circuit 18b shown in FIG. 10 is shown in FIG. 11. At standby 23, the DOEP signal generated by the control circuit 15 is low in level and DOE is brought to a low level, and a chip's output DQ is brought to high impedance. Upon an operation 24, the output control circuit 18b outputs a data signal CO according to an output MO from the read circuit 17. DOEP is also brought to a high level so that DOE is taken high in level. Thus, an output circuit 19 is activated.

Upon DPD 22, the PD signal becomes high in level and a PDB signal becomes low in level. Therefore, DOE is forcedly fixed to a low level and the chip's output DQ is brought to high impedance. Since the supply of the voltage for VPERI is cut upon DPD, MO and DOEP operated with VPERI become undefined. However, since PDB is set to the low level, the outputs CO and DOE are respectively fixed to the low level. Since the N channel MOSFET 53 is turned off, no through current does not flow either.

In the embodiment shown in FIG. 1, a large current flows because the switch means 20a supplies the voltage VDDIN and the current to the input circuit 12 and the power supply circuit 13a. With a view toward reducing a voltage drop developed due to the parasitic resistance of the switch means 20a, it is necessary to appreciably increase the constant of MOSFET constituting the switch means 20a. However, it is also considered that since a problem about an increase in layout area arises, a VDDIN wiring is added within the chip, and the parasitic resistance of each wiring is also reduced, a thick wiring of about several tens of μm, for example is required and hence the layout area further increases.

Figure 12:
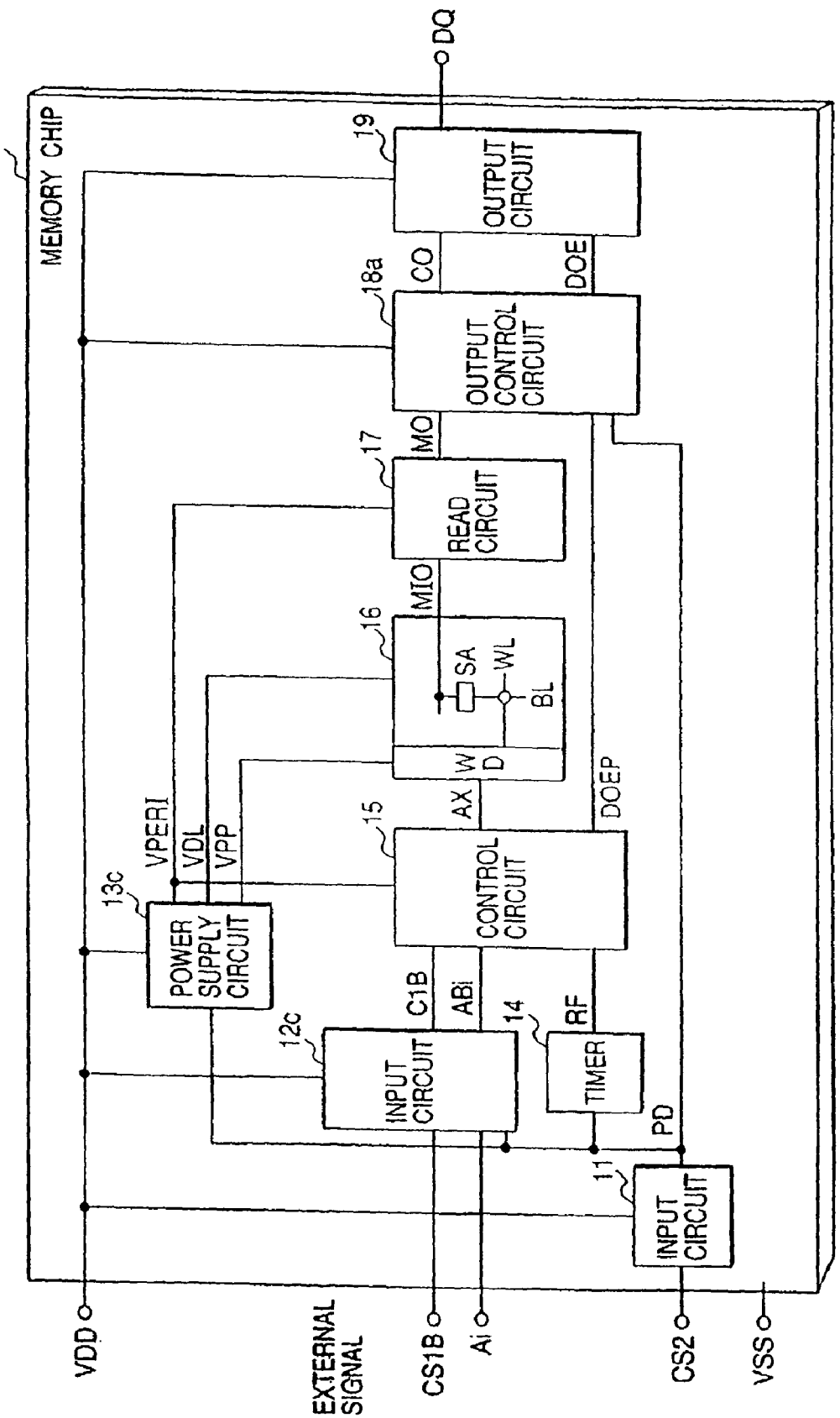
FIG. 12 is a block diagram showing a further embodiment of a DRAM according to the present invention.

A block diagram of a further embodiment of a DRAM according to the present invention is shown in FIG. 12. In the present embodiment, an input circuit 12c and a power supply circuit 13c respectively carry out such a contrivance as to separately perform current cut upon DPD in consideration of the above problem in the embodiment shown in FIG. 1. Namely, a power supply voltage VDD supplied from an external terminal is supplied to the input circuit 12c and the power supply circuit 13c on a steady basis respectively. A signal PD is supplied to the input circuit 12c and the power supply circuit 13c to carry out current cut upon DPD individually. In addition to the above, the present embodiment is similar to and identical to the FIG. 1 in operation too.

In the present embodiment, a wiring for an internal power supply voltage VDDIN becomes unnecessary and a layout area can be reduced. In the power supply circuit 13c, as will be described later, a voltage applied to the gate of an output MOSFET for supplying each voltage and current is controlled so that the current is cut upon DPD. Thus, the MOSFET large in current supply capacity like the switch means 20a shown in FIG. 1 becomes unnecessary. The power supply circuit can comprise only a small circuit for controlling the gate voltage of the output MOSFET, and the layout area can be reduced.

Figure 13:
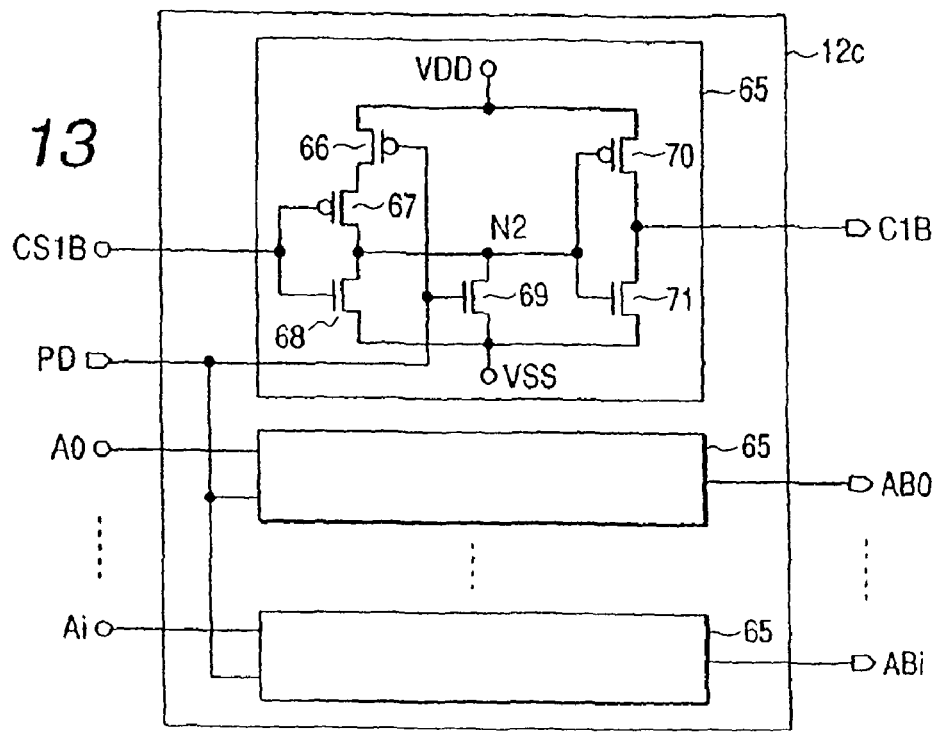
FIG. 13 is a circuit diagram illustrating one embodiment of an input circuit 12c shown in FIG. 12.

A circuit diagram of one embodiment of the input circuit 12c shown in FIG. 12 is shown in FIG. 13. The input circuit 12c comprises a plurality of logic circuits 65 corresponding to external input signals. As a logic circuit 65 corresponding to an external input signal CS1B is illustratively shown as typical, the logic circuit 65 comprises a NOR gate circuit made up of MOSFETs 66, 67, 68 and 69, and an inverter circuit made up of MOSFETs 70 and 71. The logic circuit 65 is operated with a source voltage VDD supplied from an external terminal.

The respective logic circuits 65 corresponding other signals A0 through Ai including the signal CS1B are commonly supplied with a power-down signal PD as a control signal. The present embodiment shows a case in which external input signals (chip select signal CS1B and address signal Ai) and their output signals (C1B and ABi) are in phase. However, an inverter circuit may be added to the logic circuit 65 according to the next-stage circuit receiving the output signals therein so that they are set as inverted signals.

Figure 14:
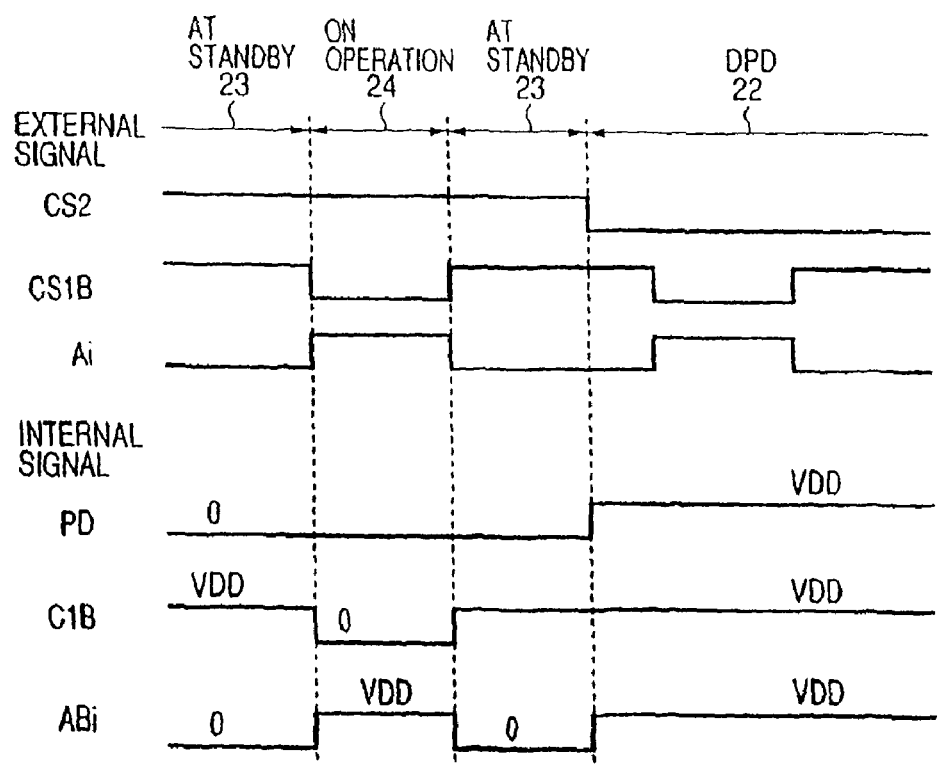
FIG. 14 is an operation waveform diagram for describing one example of the operation of the input circuit 12c shown in FIG. 13.

An operation waveform diagram for describing one example of the operation of the input circuit 12c shown in FIG. 13 is shown in FIG. 14. Upon standby 23 and an operation 24, the power-down signal PD is brought to a low level in response to a high level of a signal CS2, and C1B and ABi are outputted according to the external input signals (chip select signal CS1B and address signal Ai), so that the next-stage internal circuits are operated.

Upon DPD 22 corresponding to a low level of the signal CS2, the power-down signal PD is brought to a high level and the MOSFET 66 of each logic circuit 65 is turned off and the MOSFET 69 is turned on. Thus, an internal node N2 is fixed to a low level and the outputs (C1B and ABi) are respectively fixed to a high level. Since the outputs (C1B and ABi) remain unchanged even if the external input signals are transitioned, current consumption will result in 0. Since the P channel MOSFET 66 of each logic circuit 65 is turned off, no through current flows even if the corresponding external input signal is given as an intermediate potential.

Figure 15:
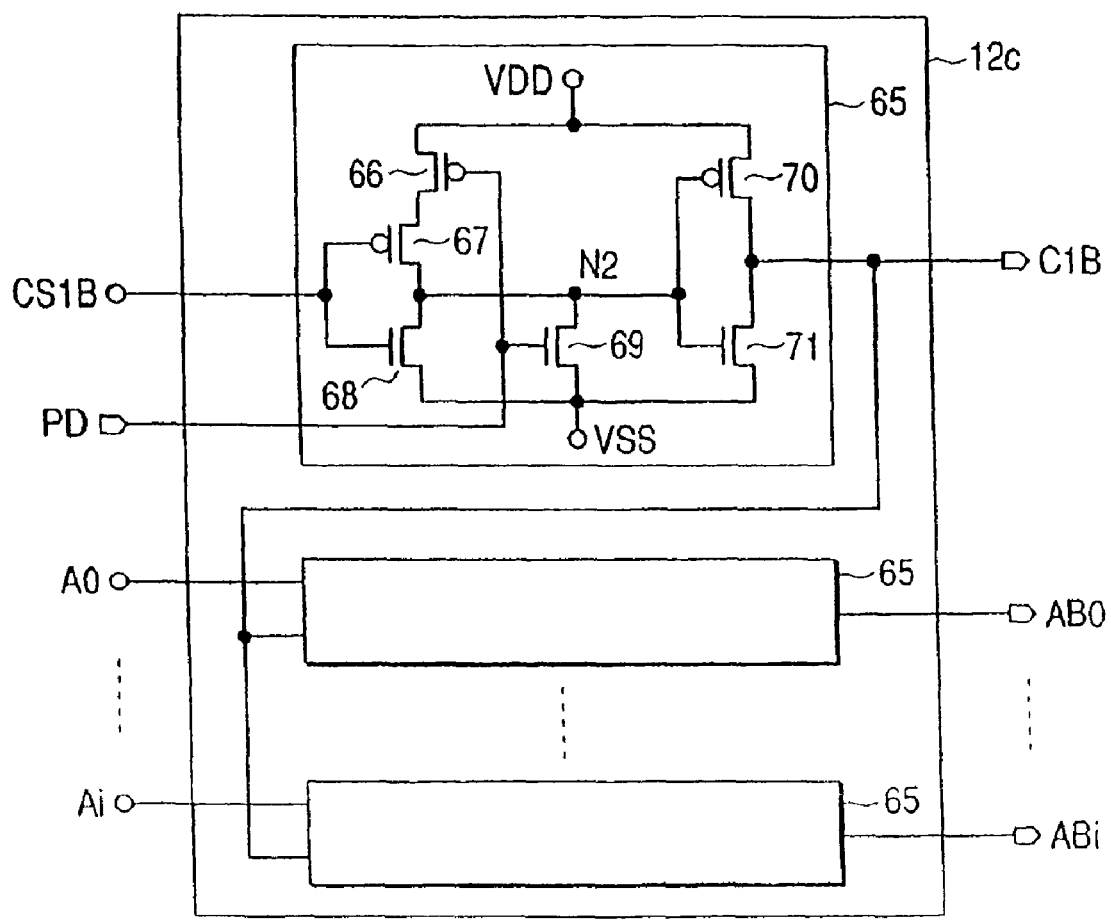
FIG. 15 is a circuit diagram showing another embodiment of the input circuit 12c shown in FIG. 12.

A circuit diagram of another embodiment of the input circuit 12c shown in FIG. 12 is shown in FIG. 15. The input circuit 12c employed in the present embodiment is different from the embodiment shown in FIG. 13 in that an output C1B of a chip select signal CS1B other than a power-down signal PD is inputted to respective logic circuits 65 which receive address signals A0 through Ai. Upon standby, the chip select signal CS1B is brought to a high level and the output C1B is also taken high in level. Thus, the respective logic circuits 65 that receive the address signals A0 through Ai, are respectively fixed to a high level in a manner similar to upon DPD in the embodiment of FIG. 13 and capable of reducing at-standby current consumption. This configuration is capable of performing sharing of a load on the input circuit 11 for forming the power-down signal PD.

While the embodiments shown in FIGS. 13 and 15 are ones wherein the description of the input circuits 12c has been made using the address signals Ai, other external input signals (write control signal, data input signal, etc.) may be applied similarly according to the memory chip. However, the input circuit 11 for receiving CS2 for controlling DPD is not included.

While signal paths for inputting write data are omitted in the respective embodiments shown in FIGS. 1, 8 and 12, it should be understood that a data input circuit is included in the output circuit 19 and a write amplifier is included in the read circuit 17. While the terminal DQ is used for both the output and input of data, the data input terminal may be provided discretely as needed.

Figure 16:
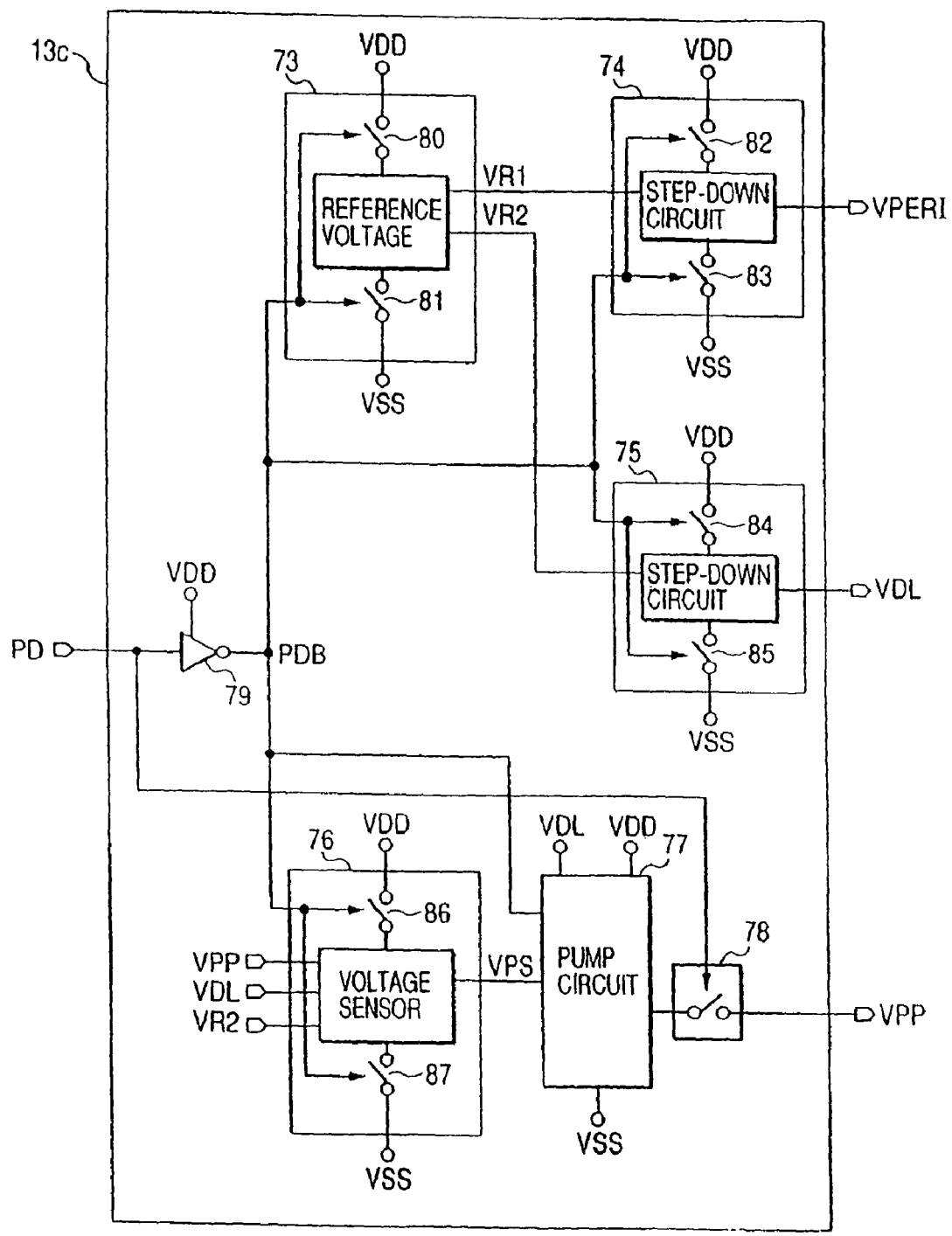
FIG. 16 is a block diagram illustrating one embodiment of a power supply circuit shown in FIG. 12.

A block diagram of one embodiment of the power supply circuit shown in FIG. 12 is shown in FIG. 16. The present embodiment comprises a reference voltage circuit 73, step-down circuits 74 and 75, a voltage sensor 76, a pump circuit 77 and switch means 78. The respective circuits 73 through 77 are controlled by a PD signal and a PDB signal inverted by an inverter circuit 879.

In the reference voltage circuit 73, step-down circuits 74 and 75 and voltage sensor 76, switch means (80 through 87) are respectively provided between VDD and VSS in their circuits. The switch means 80 through 87 are switch-controlled by the PDB signal formed by the inverter circuit 79. Upon DPD, the respective switch means 80 through 87 are turned off to cut the supply of a voltage and a current to the circuits 73 through 77. Thus, the current consumed by each of the circuits 73 through 77 results in 0. Since VPERI and VDL used as output voltages are discharged to 0V because the voltage supply is stopped. The pump circuit 77 stops its pump operation according to the PD signal to bring current consumption to 0. Upon DPD, the switch means 78 is turned off and the voltage supply is stopped, so that a boost voltage VPP is also discharged to 0V.

As described above, the currents consumed by all the power supply circuits that respectively constitute the power supply circuits, result in 0. With the deactivation of these power supply circuits, the voltage supply is stopped so that the internal voltages. VPERI, VDL and VPP are also brought to 0V. Therefore, current consumption results in 0 even in the case of the circuits (the control circuit 15, memory array 16 and read circuit 17 shown in FIG. 12) operated with these internal voltages VPERI, VDL and VPP.

Figure 17:
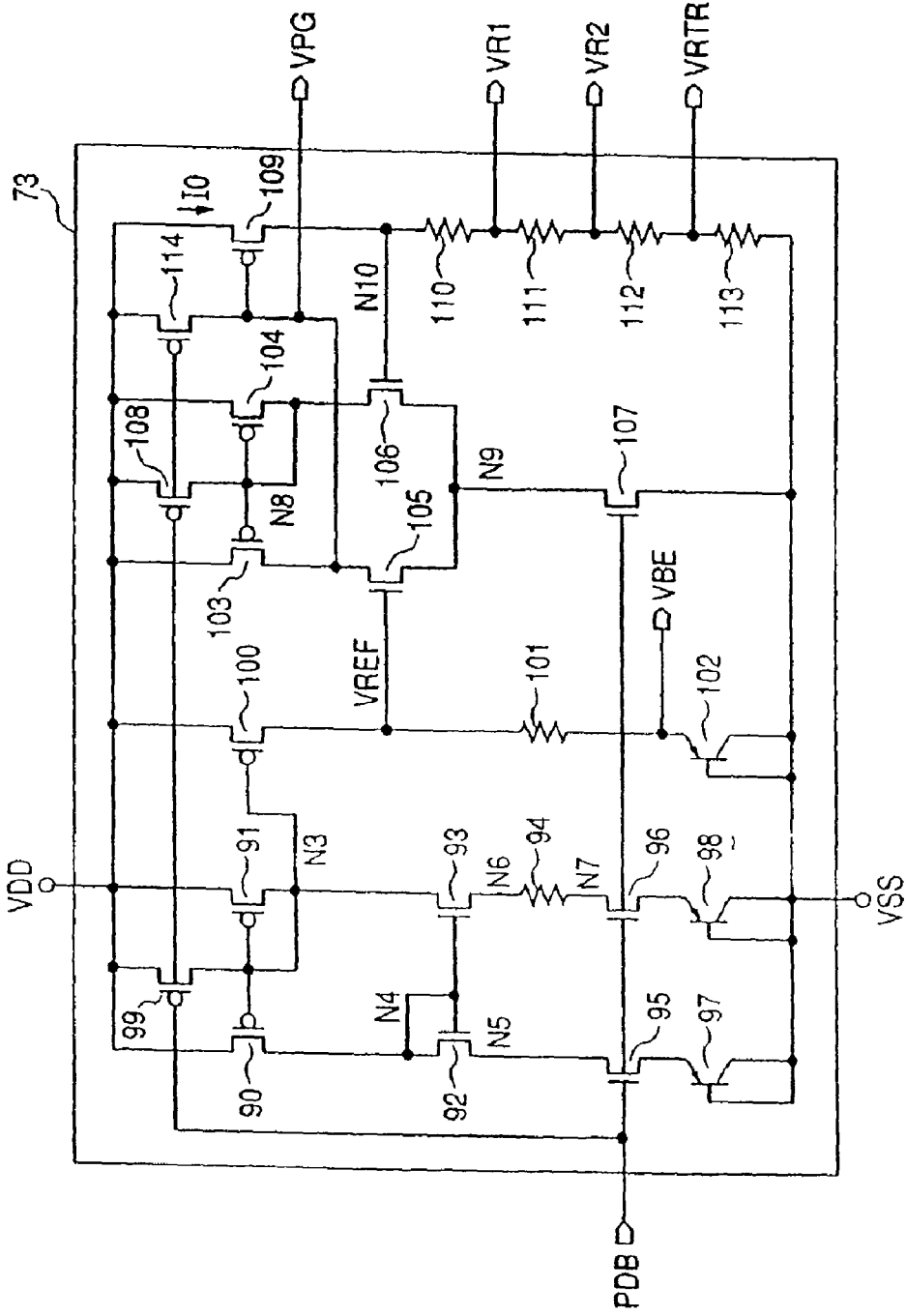
FIG. 17 is a circuit diagram depicting one embodiment of a reference voltage circuit shown in FIG. 16.

A circuit diagram of one embodiment of the reference voltage circuit shown in FIG. 16 is shown in FIG. 17. The reference voltage circuit comprises a reference voltage generating circuit and a reference voltage level converting circuit. The reference voltage generating circuit extracts or takes out a difference voltage between a base and an emitter, corresponding to the difference in emitter current density between bipolar transistors 97 and 98, causes it to flow through a resistor 94 to thereby form a constant current, and allows the constant current to flow through a resistor 101 by virtue of a current mirror circuit to thereby form a reference voltage VREF. The resistor 101 is supplied with a base-to-emitter voltage VBE of a transistor 102 to carry out temperature compensation.

The reference voltage level converting circuit compares the reference voltage VREF and a voltage at a node N10, which is formed by causing a current I0 to flow through series resistors 110 through 113, by means of differential MOSFETs 105 and 106, and forms such a control voltage VPG that both coincide with each other to thereby control a MOSFET 109 for forming the current I0. With the operation of the differential circuit, the reference voltage VREF and the potential at the node N10 coincide with each other, and it is divided by the series resistor circuit of 110 through 113 to form level-converted reference voltages VR1, VR2 and VRTR.

N channel MOSFETs corresponding to MOSFETs 95 and 96 added to perform current cut at DPD, and P channel MOSFETs designated at numerals 99, 108 and 114 are added. An N channel MOSFET designated at numeral 107 is an element for forming an operating current for a differential amplifier, which is used for the current cut at DPD by being controlled based on a PDB signal.

The description at standby and operation of the reference voltage circuit employed in the present embodiment is as follows. VREF becomes a constant voltage which does not depend on the temperature and VDD. The reference voltage level converting circuit controls VPG so that VREF and the internal node N10 take the same voltage. The current I0 flows through the P channel MOSFET 109. The voltage at the internal node N10 is determined based on the current I0 and the resistors 110, 111, 112 an 113. The current I0 becomes a constant current which does not depends on the temperature and VDD. The respective output voltages VR1, VR2 and VRTR are determined by the current I0 and the resistors 110, 111, 112 and 113 and result in constant voltages which does not depend on the temperature and VDD.

Upon DPD, PDB becomes a low level and the MOSFETs 95, 96 and 107 are turned off to cut a current path to the VSS side. On the other hand, the P channel MOSFET 99 is turned on to increase a node N3 to the power supply voltage VDD. Thus, P channel MOSFETs 90, 91 and 100 in which N3 is used as their gate inputs, are turned off to cut a current from the power supply voltage VDD. Similarly, the P channel MOSFETs 108 and 114 are turned on to raise a node N8 and VPG to VDD. Consequently, their corresponding P channel MOSFETs 103, 104 and 109 are turned off to cut the current from the power supply voltage VDD. Since the currents from VDD and VSS are cut in this way, current consumption results in 0.

The respective output voltages VR1, VR2 and VRTR are discharged to 0V through the resistors 110, 111, 112 and 113. Since the MOSFETs 95 and 96 switch-controlled by the PDB signal are added to provide speeding up and stabilization of the operation, they may be omitted.

Figure 18:
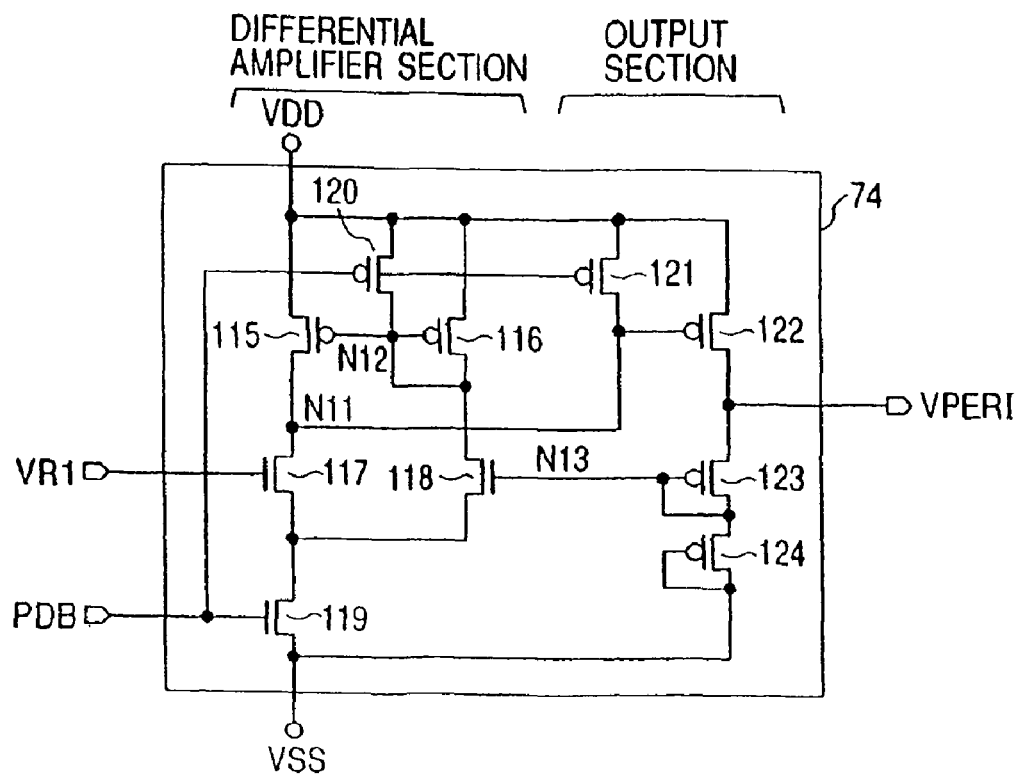
FIG. 18 is a circuit diagram showing one embodiment of a step-down circuit shown in FIG. 16.

A circuit diagram of one embodiment of the step-down circuit shown in FIG. 16 is shown in FIG. 18. The present embodiment is a circuit for generating a voltage VPERI equal to twice the reference voltage VR1. The present circuit comprises a differential amplifier section including MOSFETs 117 and 118, and an output section including a MOSFET 122. Namely, P channel MOSFETs 123 and 124 provided in a diode form are provided between the drain of the output MOSFET 122 and a circuit's ground potential and supplied with a current from the output MOSFET 122. A differential amplifier is operated so as to allow a voltage at a node N13 corresponding to a connecting point of both the MOSFETs 123 and 124 and the reference voltage VR1 to coincide with each other, whereby a voltage formed by a series circuit of the two diode-configured MOSFETs 123 and 124 is set to the voltage VPERI equal to twice the reference voltage VR1.

P channel MOSFETs 120 and 121 for current cut are added in the present embodiment. A MOSFET 119 is one for forming an operating current of the differential amplifier. The MOSFET 119 is one used for supplying a PDB signal thereto to thereby cut an operating current at DPD.

Upon standby and operation, the MOSFETs 123 and 124 form the voltage equal to one half of VPERI at the node N13 as described above. The differential amplifier section compares VR1 and the voltage at the node N13. When VR1>N13, the potential at a node N11 is lowered so that the P channel MOSFET 122 increases the supply of a current to the MOSFETs 123 and 124. When VR1<N13 in reverse, the potential at the node N11 is raised so that the P channel MOSFET 122 reduces the supply of the current to the MOSFETs 123 and 124. The present embodiment controls so as to bring about VR1=N13 and serves so as to hold VPERI as a constant voltage.

Upon DPD, the PDB signal is taken low in level and the MOSFET 119 is turned off to cut a current to the VSS side. On the other hand, the P channel MOSFETs 120 and 121 are turned on to raise the nodes N11 and N12 to VDD. Consequently, their corresponding P channel MOSFETs 115, 116 and 122 are turned off so that the current from VDD is also cut. Owing to the above, current consumption at DPD can be brought to 0.

The P channel MOSFET 122 for supplying a current for the step-down voltage VPERI needs large drive capacity, and its layout area is also large. When the switch means 20a is made up of the P channel MOSFET and is inserted between the P channel MOSFET and VDD as in the embodiment shown in FIG. 1, the respective P channel MOSFETs need a size equal to twice that shown in FIG. 18 and is increased to four times in layout area. On the other hand, since the P channel MOSFET 121 for increasing the potential at the node N11 inputted to the gate of the MOSFET 122, to VDD may be low in drive capacity in the case of the configuration shown in FIG. 18, its layout area can be reduced.

Figure 19:
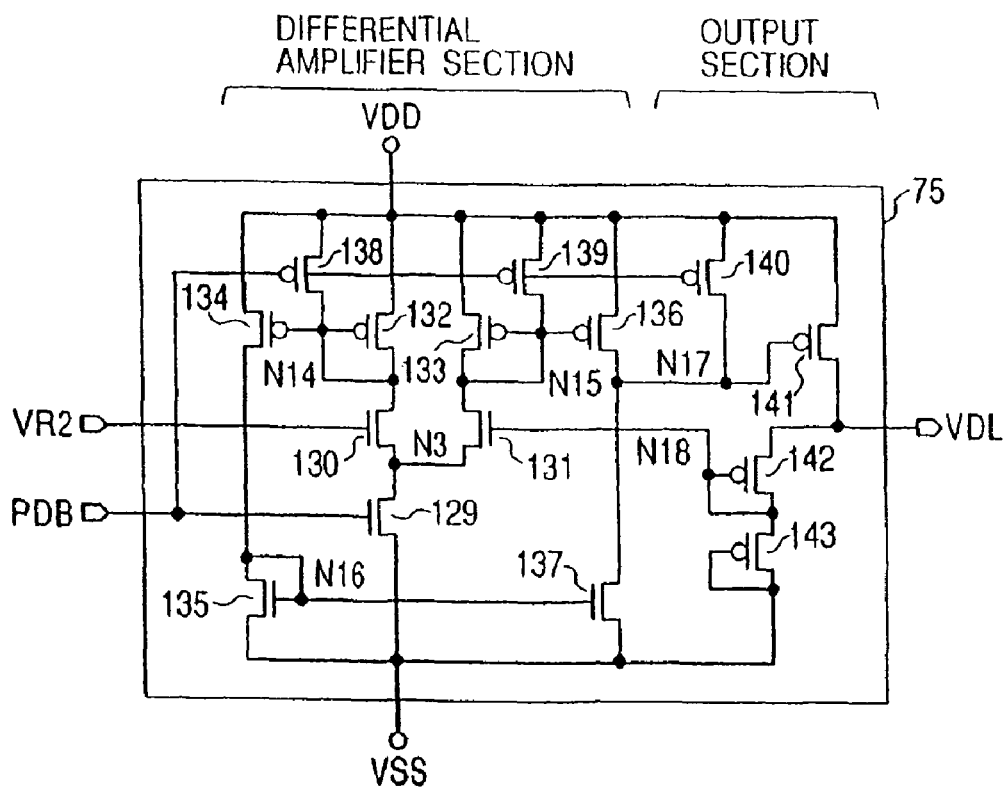
FIG. 19 is a circuit diagram illustrating another embodiment of the step-down circuit shown in FIG. 16.

A circuit diagram of another embodiment of the step-down circuit shown in FIG. 16 is shown in FIG. 19. The present embodiment is a step-down circuit for generating a voltage VDL equal to twice the reference voltage VR2. The present embodiment is different from the embodiment of FIG. 18 in that a differential amplifier section is provided as a two-stage configuration and the amplitude at an output node N17 of a differential amplifier is increased. The present embodiment is similar to FIG. 18 in other points. Increasing the amplitude at the output node N17 of the differential amplifier makes it possible to reduce a transistor size of an output P channel MOSFET 141. Namely, since a gate-to-source voltage Vgs can be made great, a large current can be carried even if the transistor size is reduced. For the purpose of on-DPD, P channel MOSFETs 138, 139 and 140 for current cut are added. The subsequent configuration is similar to the embodiment shown in FIG. 18.

Figure 20:
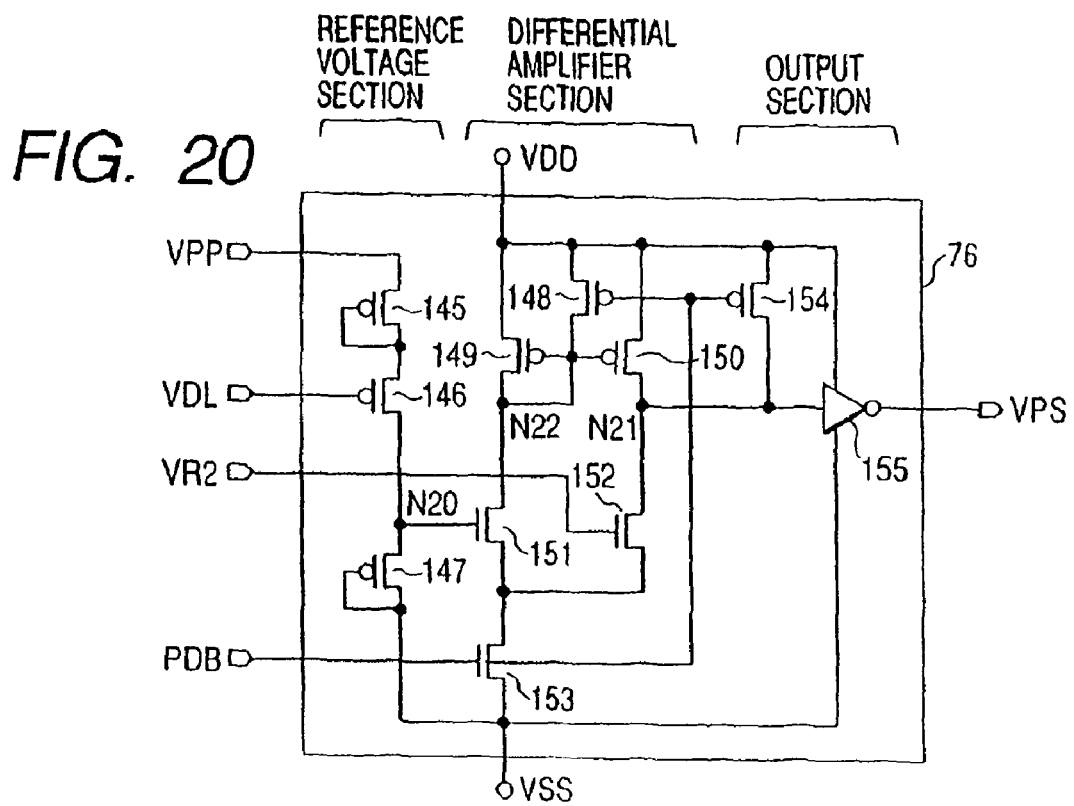
FIG. 20 is a circuit diagram depicting one embodiment of a voltage sensor shown in FIG. 16.

A circuit diagram of one embodiment of the voltage sensor shown in FIG. 16 is shown in FIG. 20. The voltage sensor of the present embodiment is one wherein when the voltage of VPP is lower than a constant voltage, the reduction or drop in the voltage is detected to bring VPS to a high level, and a pump circuit is activated to increase the voltage of VPP. The voltage sensor comprises a reference voltage section, a differential amplifier section and an output section. P channel MOSFETs 145, 146 and 147 set in a diode form are provided to divide VPP and form a divided voltage of (VPP−VDL)/2 from an output node N20. Differential MOSFETs 151 and 152 compare the voltage at the node N20 and a reference voltage VR2 and outputs a detect signal VPS from an inverter circuit 155 according to the result of comparison. While the differential amplifier section has been described as a one-stage configuration in the present embodiment, the differential amplifier having the two-stage configuration, which is used in FIG. 19, may be adopted.

P channel MOSFETs 148 and 154 are added for current cut at DPD. An N channel MOSFET 153 is a constituent element of the differential amplifier in the same manner as described above. This is also one used for supplying a PDB signal to the gate of the MOSFET 153 and thereby performing current cut of the differential amplifier at DPD.

Figure 21:
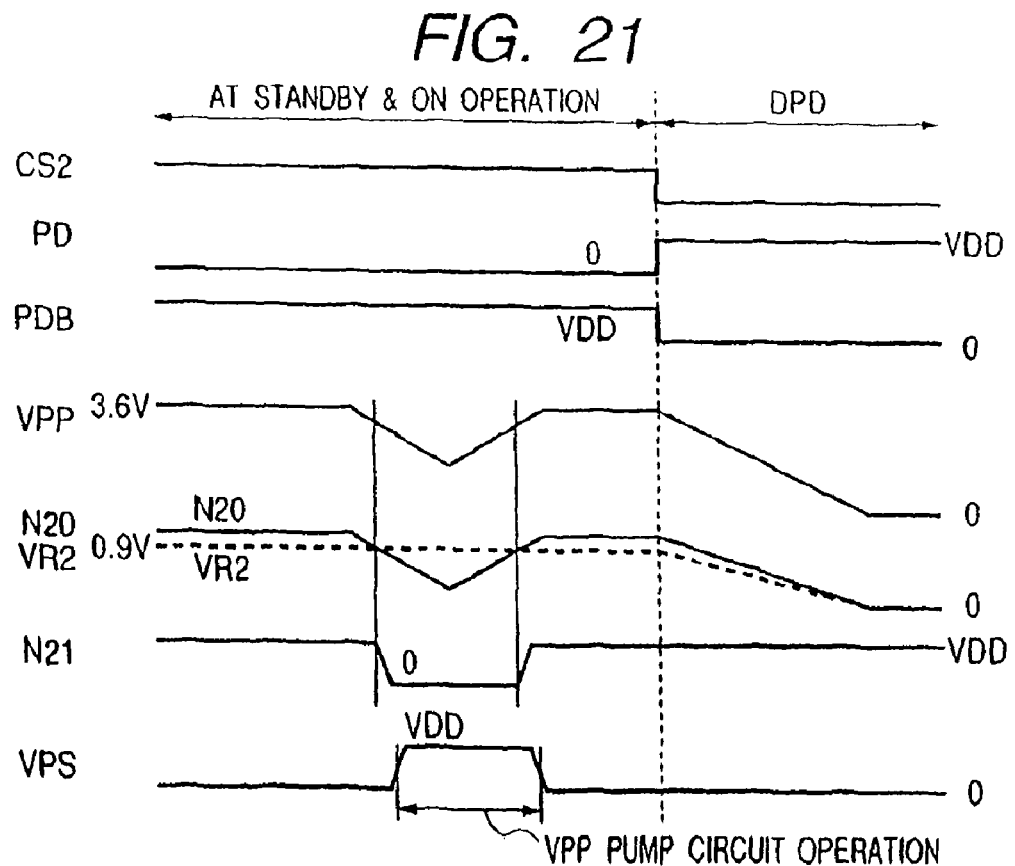
FIG. 21 is an operation waveform diagram for describing one example of the operation of the voltage sensor shown in FIG. 20.

An operation waveform diagram for describing one example of the operation of the voltage sensor shown in FIG. 20 is shown in FIG. 21. When a circuit (word driver WD of memory array 16 shown in FIG. 12) supplied with the boost voltage VPP is operated, VPP becomes low. Thus, when the voltage at N20 is lowered and N20<VR2 (=0.9V), N21 becomes low in level, and the output VPS is brought to a high level. At this time, the pump circuit of VPP is operated to increase VPP. When VPP is increased by the operation or the like of the pump circuit at the non-selection of a word like and thereby the voltage at N20 is raised and N20>VR2 (=0.9V), N21 is taken high in level and the output VPS becomes low in level. Thus, the pump circuit of VPP is deactivated. The operation of the pump circuit is controlled by the output VPS of such a voltage sensor so that such a boost voltage VPP as regarded as constant can be obtained.

Upon DPD, the PDB signal becomes low in level and hence the MOSFET 153 is turned off to cut a current to VSS. On the other hand, the P channel MOSFETs 148 and 154 are turned on to raise the nodes N21 and N22 to VDD. Therefore, P channel MOSFETs 149 and 150 are turned off to cut a current from VDD. Since the node N21 is fixed to VDD, the inverter circuit 155 fixes the output VPS to the low level and causes no current to flow either.

Figure 22:
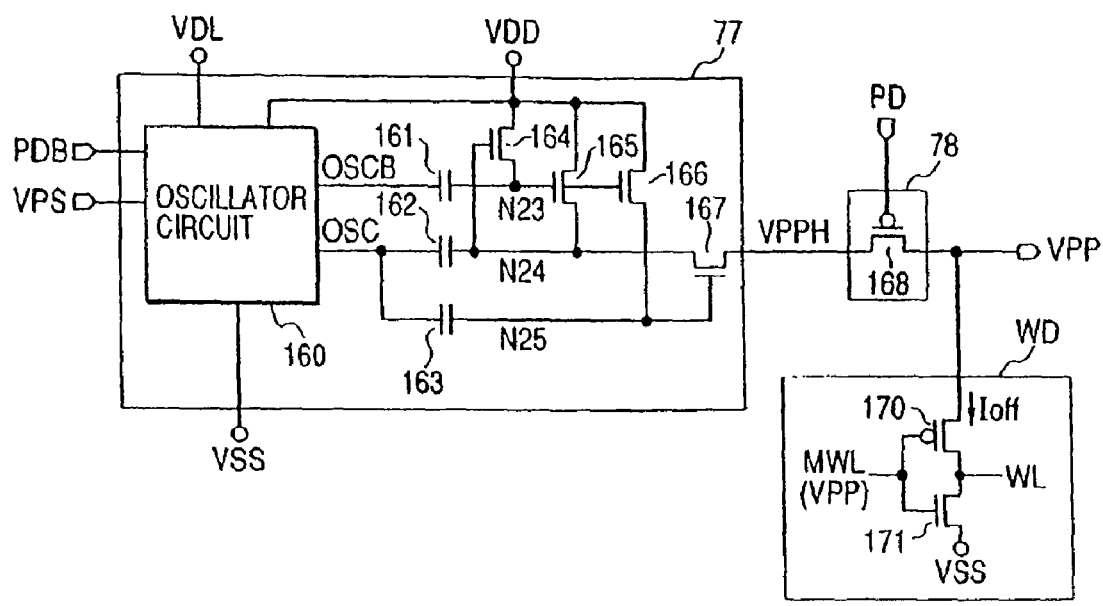
FIG. 22 is a circuit diagram showing one embodiment of a VPP pump circuit 77 shown in FIG. 16.

One embodiment of a VPP pump circuit 77 shown in FIG. 16 is illustrated in FIG. 22. The pump circuit 77 comprises an oscillator circuit 160, boost capacitors 161, 162 and 163, a charge transfer N channel MOSFET 167, and precharge N channel MOSFETs 164, 165 and 166. Although not restricted in particular, an output voltage VPPH of the pump circuit is supplied to an internal voltage VPP via switch means 78. The switch means 78 comprises a P channel MOSFET 168 and is controlled by a PD signal.

The boost voltage VPP is supplied to the word driver WD of the memory array 16 employed in the embodiment shown in FIG. 12. The output of the word driver WD is made up of a P channel MOSFET 170 and an N channel MOSFET 171. An output signal thereof is set to a level for selecting each word line WL. While a main word line MWL takes VPP in a standby state and the P channel MOSFET 170 is turned off, a small off-current flows. Since the number of word lines WL increases like about 1600 in the case of such a DRAM that its memory capacity is of 32M bits, even the small off-current results in an inneglible current (several tens of .mu.A) over the whole chip. Therefore, the cutting of the supply of the current to VPP is meaningful upon DPD. The switch means 78 is made up of the P channel MOSFET 168 as described above and controlled by the PD signal having VDD amplitude, whereby the supply of the current to VPP can be fully cut.

Figure 23:
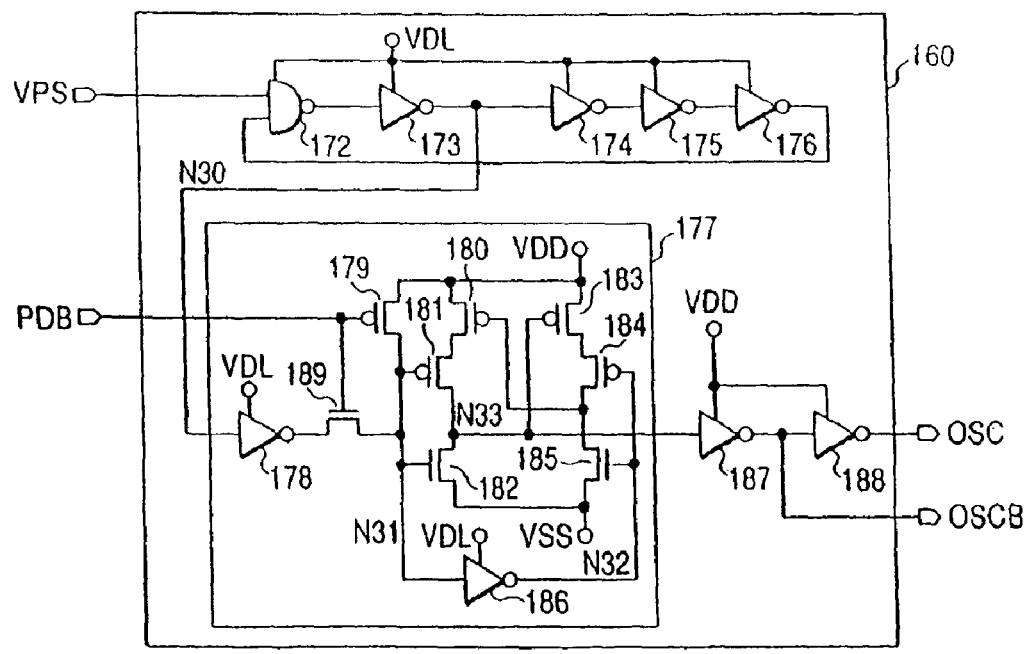
FIG. 23 is a circuit diagram illustrating one embodiment of an oscillator circuit 160 shown in FIG. 22.

A circuit diagram illustrating one embodiment of the oscillator circuit 160 shown in FIG. 22 is shown in FIG. 23. The oscillator circuit 160 comprises a ring oscillator which comprises a NAND gate circuit 172 and inverter circuits 173 through 176. The NAND gate circuit 172 and the inverter circuits 173 through 176 are operated by a step-down voltage VDL corresponding to a constant voltage to thereby hold an oscillation cycle or period constant. Namely, a problem arises in that when they are operated by the power supply voltage VDD, the voltage changes within specs, when the oscillation period is excessively short, the efficiency of conversion by the pump circuit is degraded, and when the oscillation period is excessively long, the supply capacity of a current is degraded. In the present embodiment, a pulse having a desired oscillation period or cycle can be stably obtained by operating the oscillator circuit with the constant voltage VDL.

Although not restricted in particular, the ring oscillator is controlled by the output signal VPS of the voltage sensor. When VPS is high in level, it oscillates, whereas when VPS is low in level, it is deactivated. The operation of the pump circuit is controlled under the control of such an oscillator circuit. Reference numeral 177 indicates a level converting circuit. In the level converting circuit, an inverter circuit 186 forms complementary pulses N31 and N32 and supplies them to the input of a CMOS inverter circuit which comprises N channel MOSFETs 182 and 185 and P channel MOSFETs 181 and 184. Such P channel MOSFETs 180 and 183 as to perform a latch operation in response to outputs of other inverter circuits each other are provided between the drains of the P channel MOSFETs 180 and 183 and the power supply voltage VDD to thereby convert an output node N30 of the ring oscillator from a VDL level to a VDD level.

An N channel MOSFET 189 controlled by a PDB signal and a P channel MOSFET 179 are added. Upon DPD, the MOSFET 189 is turned off and the MOSFET 179 is turned on to fix an output signal OSC to a low level and fix OSCB to a high level.

Figure 24:
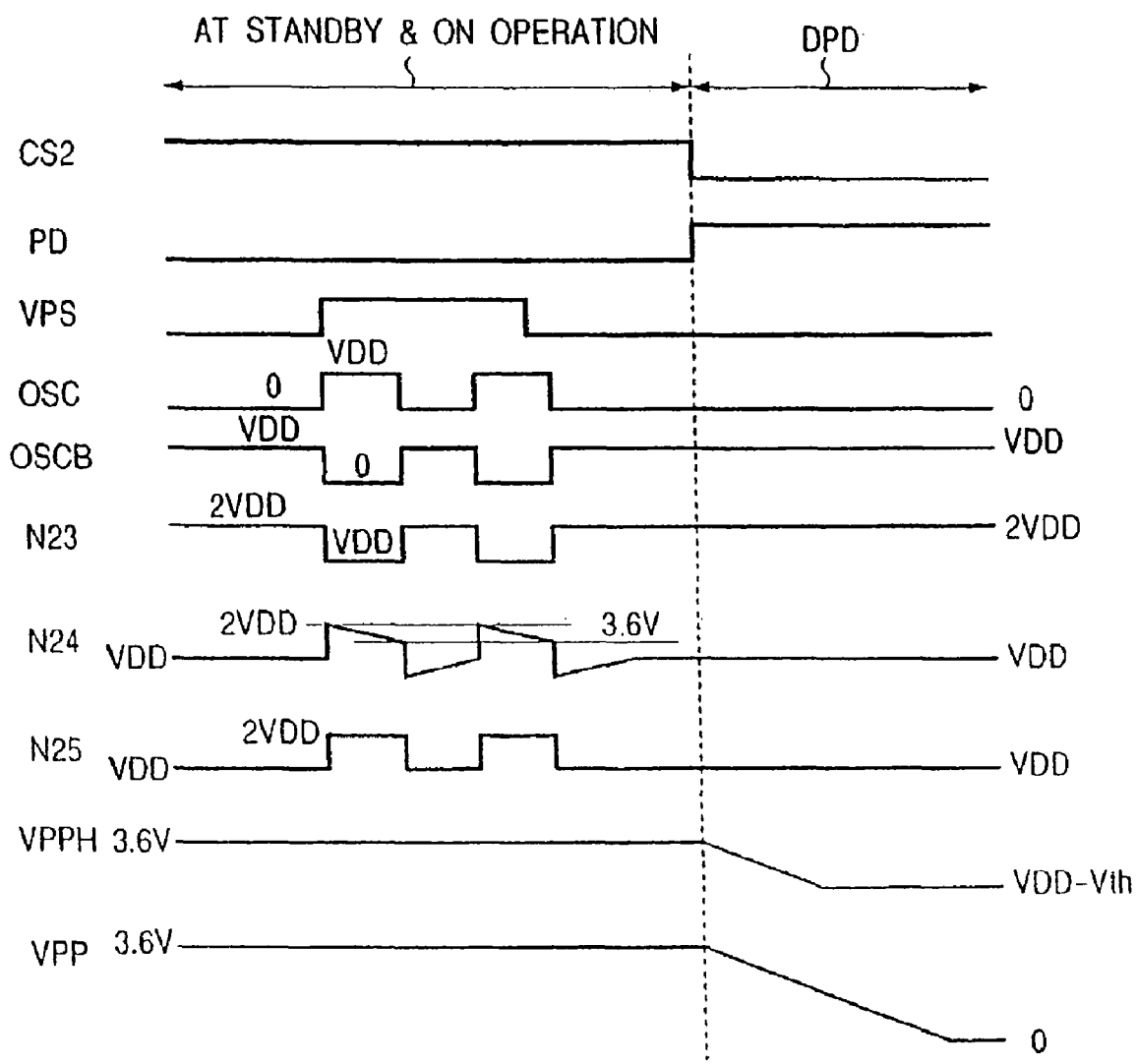
FIG. 24 is an operation waveform diagram for describing one example of the operation of the pump circuit shown in FIG. 22.

An operation waveform diagram for describing one example of the operation of the pump circuit shown in FIG. 22 is illustrated in FIG. 24. When VPS is taken high in level upon standby and an operation, an internal node N24 is boosted to 2 VDD by OSC and an electrical charge is transferred to VPP via the MOSFETs 167 and 168.

Upon DPD, N24 and N25 are both fixed to VDD. The output VPPH of the pump circuit is simply lowered to VDD-Vth by the P channel MOSFET 168. Since, however, the gate PD of the P channel MOSFET 168 of the switch means 78 is VDD, a gate voltage thereat becomes higher than a voltage at the source thereof. Thus, the P channel MOSFET 168 is fully turned off so that VPP is discharged to 0V. Therefore, the off-current at the word driver WD can be brought to 0.

In the normal DRAM, an information holding characteristic of each memory cell is enhanced with a substrate potential of a memory array as a negative voltage VBB lower than VSS. It should be understood that while the substrate voltage VBB is omitted in the respective embodiments shown in FIGS. 1, 8 and 12, a VBB generating circuit is included in each of the power supply circuits 13*a*, 13*b* and 13*c*, and a VBB voltage is supplied to the memory array 16.

The VBB generating circuit has a configuration similar to the VPP generating circuit shown in FIG. 16 and comprises a voltage sensor and a pump circuit. In the voltage sensor, switch means is provided between VDD and VSS and switch-controlled by a PDB signal to cut the supply of a voltage and a current upon DPD. The operation of the pump circuit is controlled by the PDB signal. Upon DPD, the pump circuit stops its pump operation to stop the supply of a current and a voltage to VBB. Thus, current consumption at DPD results in 0 even in the VBB generating circuit.

Figure 25:
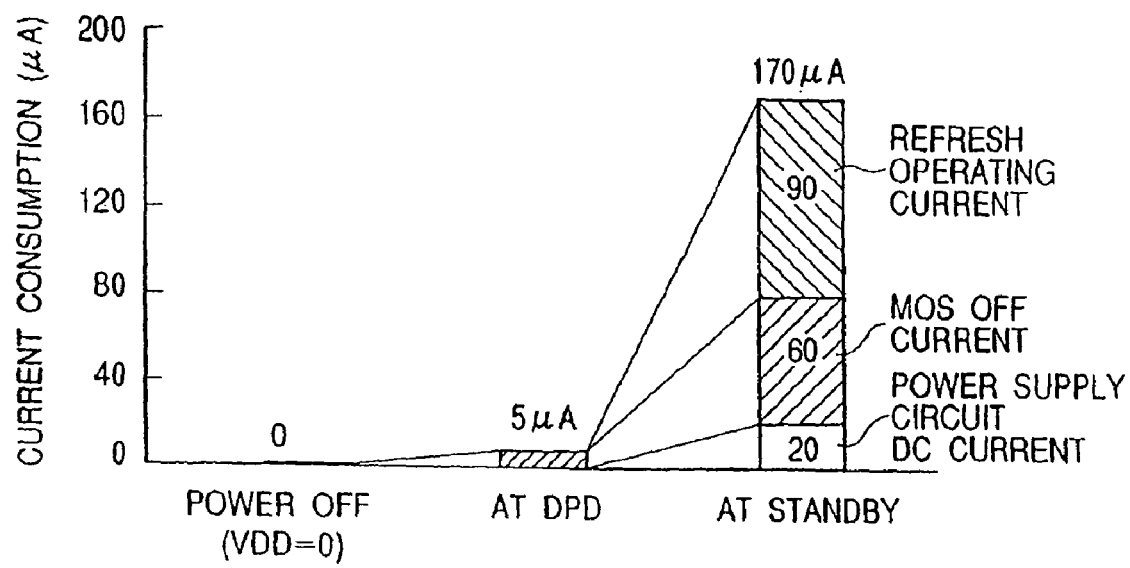
FIG. 25 is an explanatory view showing one example illustrative of a breakdown of current consumption of a DRAM chip to which the present invention is applied.

An explanatory view showing one example illustrative of a breakdown of current consumption of a DRAM chip to which the present invention is applied, is shown in FIG. 25. Although not restricted in particular, memory capacity thereof is about 32M bits, an interface has compatibility with a static RAM, and a refresh operation is set as a so-called time multiplex system wherein the read/write operation and the refresh operation are executed by allocating their times thereto during one cycle or the two operations are carried out only when the read/write operation and the refresh operation compete with each other.

The DRAM according to the present embodiment has a current consumption of about 170 .mu.A at standby. The breakdown thereof is as follows. About 90 .mu.A is used as a refresh operating, current, an off current (subthreshold leak current) of MOSFET is used as about 60 .mu.A, and about 20 .mu.A is used as a DC current in the power supply circuit. At standby, i.e., when only the operation of holding data is performed, the DPD function or DPD mode like the present invention is provided for the DRAM having these current consumption to thereby bring the refresh operation and the power supply circuit to a halt and bring each internal voltage to 0, whereby the off current of the circuit operated by the internal voltage can be brought to 0. Since it is necessary to cause the input circuit 11 for receiving CS2 for giving instructions for recovery from such a DPD mode, and other circuits on a system to coexist with each other upon the above DPD, the output control circuit 18*a* and the output circuit 19 are supplied with the power supply voltage VDD on a stationary basis. Consequently, about 5 .mu.A corresponding to the off current at MOSFET results in current consumption at above DPD in the case of various switch means provided between such a power supply VDD and the respective circuits.

Figure 26:
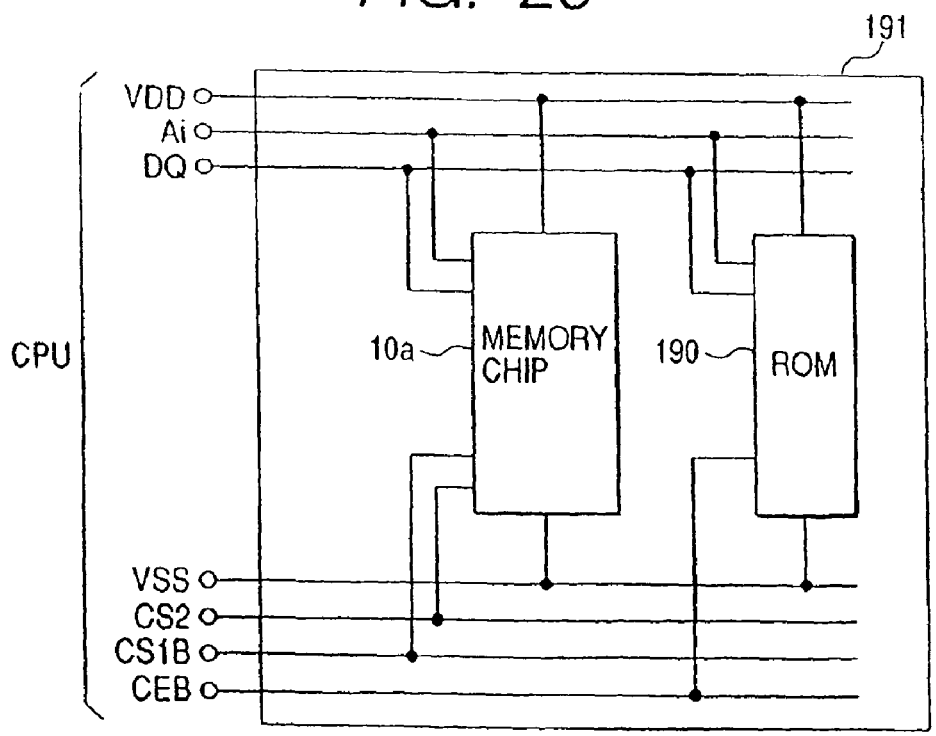
FIG. 26 is a block diagram illustrating one embodiment of a system including a memory chip according to the present invention.

A block diagram of one embodiment of a system including a memory chip according to the present invention is illustrated in FIG. 26. In the present embodiment, a memory chip 10*a* according to the present invention and another chip (ROM in the present embodiment) 190 are packaged or mounted on the same substrate. Power supply lines like VDD and VSS, an address bus Ai, aid a data bus DQ are provided on such a mounting substrate. The two chips 10*a* and 190 referred to above are connected in common.

Control signal lines intended for the memory chip 10*a* according to the present invention like CS2 and CS1B, and a control signal line intended for the ROM 190 like CEB are provided on the mounting substrate. The dedicated control signal lines are connected in association with their corresponding memory chip 10*a* and ROM 190.

A problem arises in that since a plurality of memory chips or the like are mounted on such a system, a gate voltage of an output MOSFET in an output circuit, which is outputted to the data bus DQ, is brought to an undefined level when, for example, the supply of the power supply voltage VDD to the memory chip 10*a* is shut off, and hence a current formed based on a high level, which is outputted to the data bus, flows into the off-state output MOSFET of the memory chip 10*a* according to a read signal from the ROM 190 or the like. Therefore, even in a state in which the memory chip 10*a* is in a perfectly non-operated state, it needs to take such measures as not to cause a current to flow in each circuit connected to a data bus, an address bus, a control bus, etc.

In the present embodiment, a DPD mode is specified according to instructions given from a host system such as a CPU or the like connected to the bus during a predetermined period in which the memory chip 10*a* does not perform any operation. Thus, the memory chip 10*a* such as the DRAM or the like is capable of realizing a so-called ultralow current consumption mode in which only the current of about 5 .mu.A flows, without impairing the operations of other ROM 190 and the like mounted on the same system.

Figure 27:
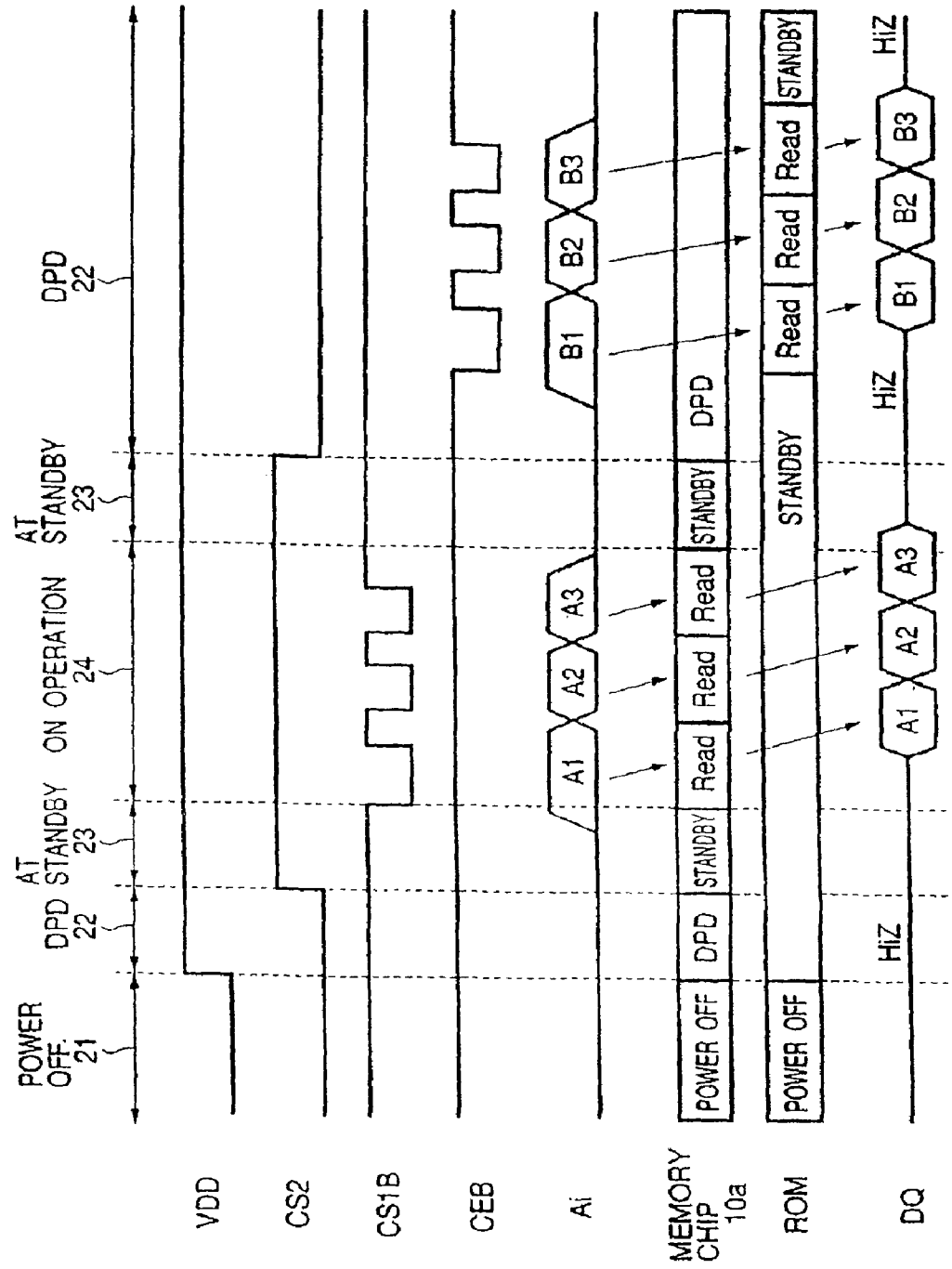
FIG. 27 is an operation waveform diagram for describing one example of the operation of the embodiment shown in FIG. 26.

An operation waveform diagram for describing one example of the operation of the embodiment shown in FIG. 26 is illustrated in FIG. 27. When CS2 is brought to a high level from the host side of the CPU or the like, the memory chip 10*a* is transitioned from the DPD mode to a standby state. When the chip enters an operating state according to CS1B at this time, it performs reading according to an address Ai and outputs read data to DQ. Next, when CS1B is kept at a high level and CS2 becomes low in level, the memory chip 10a is brought to a DPD state, so that current consumption is reduced and the output DQ is brought to high impedance.

Since the power supply voltage VDD is being applied onto the system even if the memory chip 10a is in the DPD state, the ROM is operable. Namely, CEB is brought to a low level so that the ROM is operated. Consequently, the ROM performs reading according to the address Ai and outputs read data to DQ. While the address Ai for effecting the reading on the ROM is inputted even to the memory chip 10a in the DPD state at this time, no current consumption increases because the input circuit 12 is deactivated.

While the embodiment shows the case in which the ROM and the memory chip 10a are packaged, no limitation is imposed thereon. For example, a plurality of memory chips 10a are connected to the address bus Ai, data bus DQ and power supply lines VDD and VSS, and the control signals CS2 and CS1B are provided every chips in the respective memory chips 10a, whereby an arbitrary memory chip 10a of the plurality of memory chips 10a can be selectively brought to the DPD state. Thus, there may also be adopted such a configuration that information in which part of a memory area of the system remains in a standby state, is held and other memory areas are kept in the DPD state, thereby achieving low current consumption.

Figure 28:
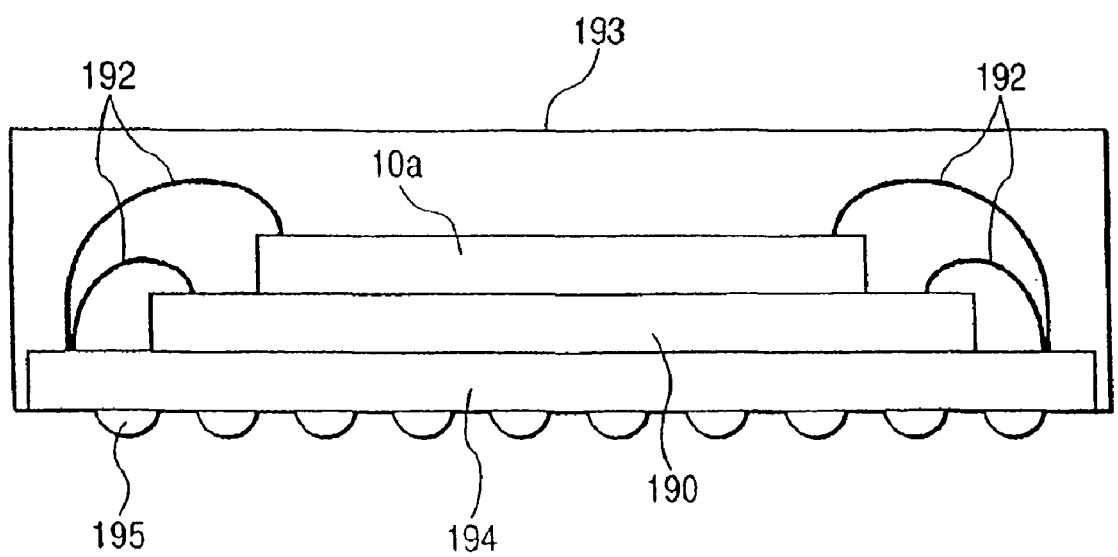
FIG. 28 is a configurational diagram showing one embodiment of a semiconductor integrated circuit device according to the present invention.

A configurational diagram of one embodiment of a semiconductor integrated circuit device according to the present invention is shown in FIG. 28. The reference numeral 193 indicates a laminated package, and the reference numeral 195 indicates a plurality of external terminals. The present embodiment is intended for the case in which the semiconductor integrated circuit device is made up of a laminated package. For example, a ROM 190 and a memory chip 10a are mounted or packaged on a package substrate 194 in an overlapped form. In this case, a laminated structure is formed such that when, for example, the memory chip 10a is small, such a memory chip small in chip size is provided above the ROM. Further, the package substrate 194 is connected to each chip by its corresponding bonding wire 192. The bonding wires 192 serve as the address bus Ai, data bus DQ or power supply lines VDD and VSS and control signal lines.

The DRAM used in a portable device or the like operated by battery driving as described above needs a reduction in at-standby current in a broad temperature region. Therefore, a refresh cycle is set so that the DRAM intended for such a portable device is capable of holding data even at such a high temperature as to be adapted to the worst case in the broad temperature region. However, the inventors of the present application have led to the invention of reducing a refresh current under the control of a refresh cycle according to a change in temperature by paying attention to the fact that the portable device or the like is frequently used in a lower temperature region, particularly, in the neighborhood of normal temperatures at which it is routinely used.

Figure 29:
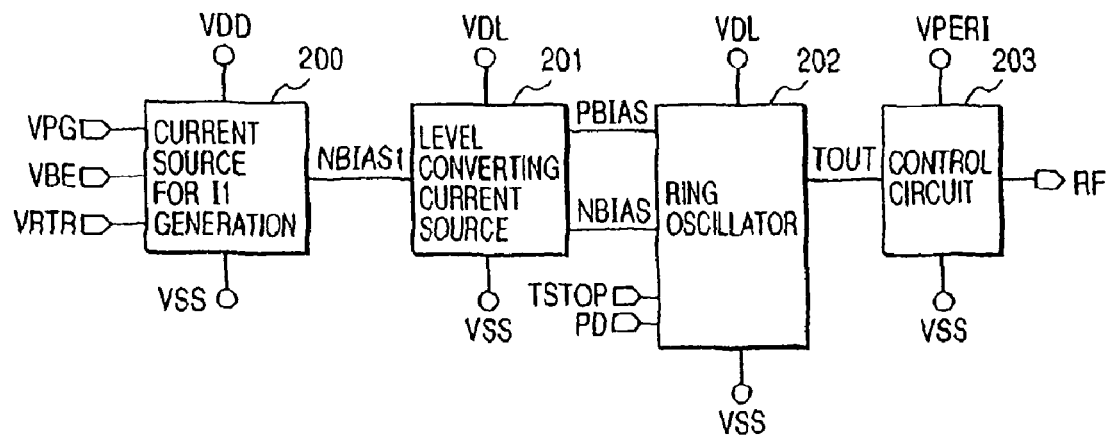
FIG. 29 is a block diagram illustrating one embodiment of a refresh timer mounted in a DRAM according to the present invention.

A block diagram of one embodiment of a refresh timer mounted in a DRAM according to the present invention is shown in FIG. 29. In the same drawing, reference numeral 200 indicates a current source for generating a current I1 having temperature dependence corresponding to the time required to hold information in each memory cell. Although not restricted in particular, the current source 200 forms a current I1 having temperature dependence by using voltages VPG, VBE and VRTR formed by the reference voltage circuit shown in FIG. 17, supplies it to a current mirror circuit and outputs it as the form of a bias voltage NBIAS1.

The current I1 generated with the external voltage VDD formed by the current source 200 is transferred to a level converting current source 201 in the form of the bias voltage NBIAS1, where it is converted into a current 11 with an internal stabilization voltage VDL as the reference. The level converting current source 201 outputs the converted current I1 in the form of bias voltages PBIAS and NBIAS formed by a current mirror circuit in the same manner. Reference numeral 202 indicates a ring oscillator for producing the current I1 as an operating current in response to the bias voltages PBIAS and NBIAS formed by the level converting current source 201. Reference numeral 203 indicates a control circuit for generating a refresh request signal RF corresponding to the output TOUT of the ring oscillator 202.

Figure 30:
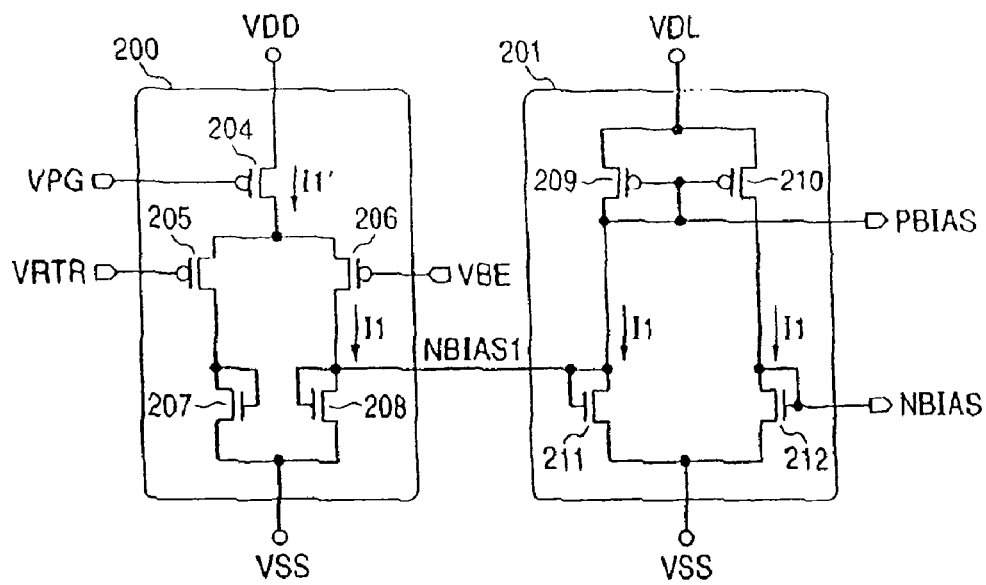
FIG. 30 is a circuit diagram showing one embodiment illustrative of a current source 200 and a level converting current source 201 shown in FIG. 29.

A circuit diagram of one embodiment illustrative of the current source 200 and the level converting current source 201 shown in FIG. 29 is shown in FIG. 30. The constant voltage VPG formed by the reference voltage circuit is inputted to the gate of a P channel MOSFET 204, whereby the constant current source (MOSFET 109) and current mirror circuit of the reference voltage level converting circuit shown in FIG. 17 is constituted. Thus, a constant current I1' equivalent to a constant current I0 hardly having power supply voltage/temperature dependence is obtained. The value of the constant current I1' is determined by a constant ratio between the MOSFET 204 and the MOSFET 109 shown in FIG. 17. This value will decide the highest operating frequency of the ring oscillator, to be described later. The highest operating frequency has a cycle corresponding to an information holding time at the allowable maximum temperature of each memory cell.

The differential amplifier inputted with the comparing voltage VRTR generated in FIG. 17 and the base-emitter voltage VBE of the bipolar transistor 102 obtains a current I1 having temperature dependence. Reference numerals 205 and 206 indicate P channel MOSFETs. The MOSFET 205 is inputted a voltage VRTR to its gate and the MOSFET 206 is inputted a voltage VBE to its gate, and the voltages VRTR and VBE are compared. Here, MOSFETs 207 and 208 function as pure load MOSFETs (resistance means) which do not constitute a current mirror. Since the voltage VRTR shows that its dependence on the power supply voltage/temperature is nearly 0, whereas the voltage VBE shows negative dependence on the temperature, the current I1 shows a characteristic that decreases with a drop in temperature. This characteristic can be adjusted by changing the level of the comparing voltage VRTR. The current I1 produced in this way is converted by the current source 201 with the internal stabilization power supply VDL as the reference.

The level converting current source 201 is configured such that the conversion into the form of a bias voltage NBIAS1 by the diode-connected MOSFET 208 through which the current I1 flows, is made, and the same currents I1 flow through an N channel MOSFET 211, P channel MOSFETs 209 and 210, and an N channel MOSFET 212 provided in a current-mirror form. Owing to the currents I1, the current mirror-configured P channel MOSFET 209 and N channel MOSFET 212 outputs them in the form of bias voltages PBIAS and NBIAS. Such a level converting operation is associated with the ring oscillator with the current I1 to be described later as an operating current being operated with VDL for the purpose of its stable operation.

Figure 31:
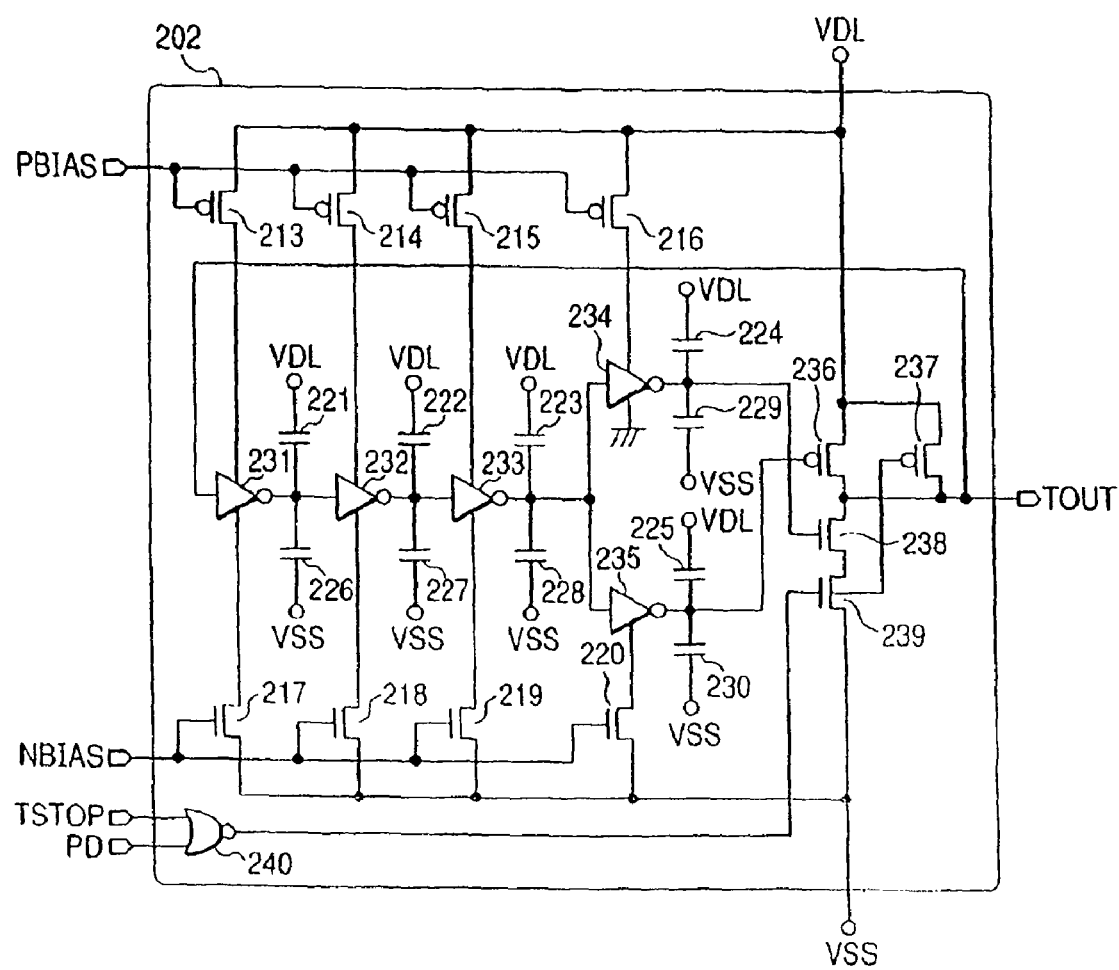
FIG. 31 is a circuit diagram depicting one embodiment of a ring oscillator 202 shown in FIG. 29.

A circuit diagram depicting one embodiment of the ring oscillator 202 shown in FIG. 29 is shown in FIG. 31. Reference numerals 231 through 235 respectively indicate inverter circuits that constitute the ring oscillator. P channel MOSFETs 213 through 216 operate a current source for determining a charge current for the inverter circuits 231 through 235 in response to the bias voltage PBIAS generated in FIG. 30. N channel MOSFETs 217 through 220 operate as a current source for determining a discharge-side current for the inverter circuits 231 through 235 in response to the bias voltage NBIAS generated in FIG. 30.

Designated at numerals 221 through 230 are respectively load capacitors for adjusting the cycle (frequency) of the ring oscillator. Designated at numeral 240 is a NOR gate circuit for generating a signal OSCSTOP used to stop the oscillator by a power-down signal PD or such a test signal TSTOP to be described later. Designated at numerals 236 through 239 are respectively MOSFETs that constitute NAND gates for stopping the oscillator by the signal OSCSTOP.

Owing to the P channel MOSFETs 213 through 216 and N channel MOSFETs 217 through 220, the operating cycle of the present ring oscillator 202 is controlled by the current I1 generated by the current source 200 shown in FIG. 30. Thus, the operating cycle has temperature dependence that it extends with a decrease in temperature owing to the temperature characteristic of the current I1, i.e., the cycle becomes long.

Figure 32:
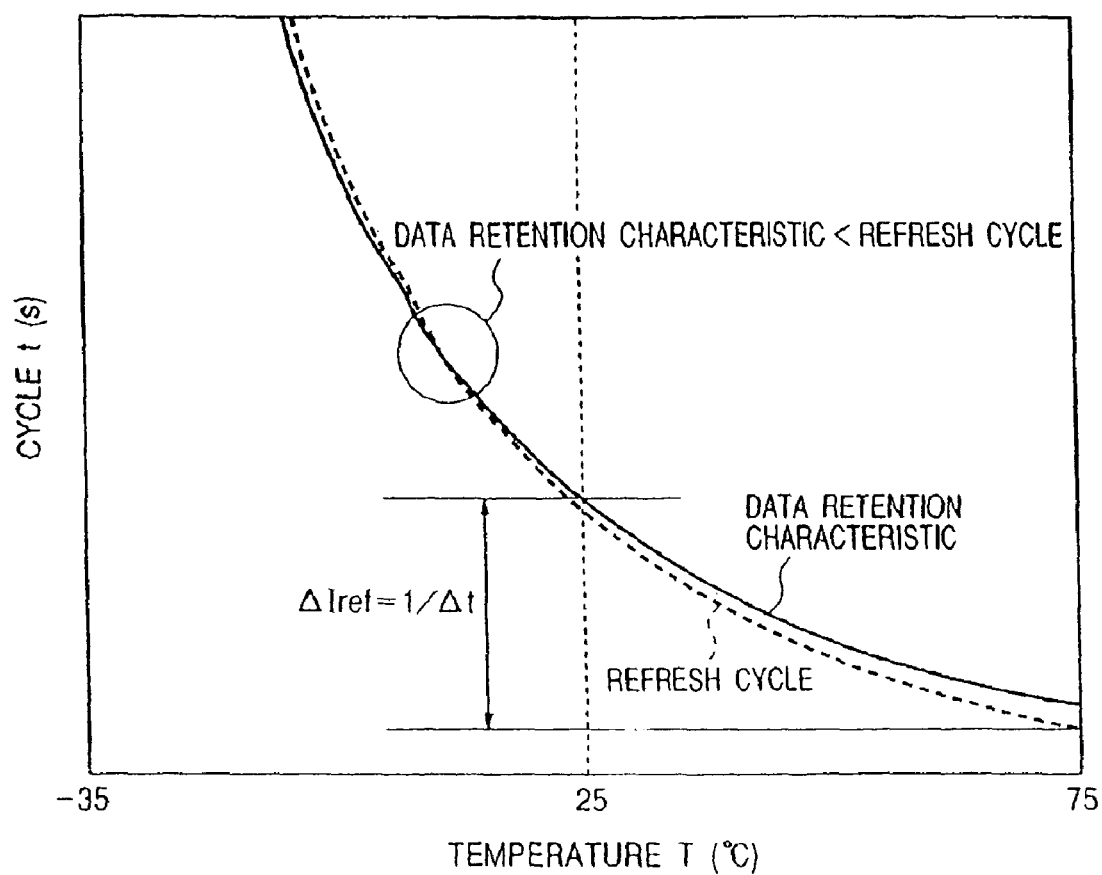
FIG. 32 is a characteristic diagram for describing temperature dependence of the refresh timer according to the present invention.

A characteristic diagram for describing temperature dependence of the refresh timer according to the present invention is illustrated in FIG. 32. When a refresh operation is performed for each operating cycle of the ring oscillator 202 or in a cycle equal to several times the cycle by the control circuit 203 shown in FIG. 29, a refresh cycle t extends with a drop in temperature as shown in the drawing. As a result, a refresh current Iref decreases at a rate of 1/.DELTA.t with the decrease in temperature.

.DELTA.t is adjusted according to a use temperature range. When it is unnecessary to take into consideration a use in an extremely low temperature region, for example, the effect of reducing Iref is given priority and .DELTA.t is set large. When the use in the extremely low temperature region is taken into consideration, there is a possibility that the operating cycle t of the ring oscillator 202 will exceed a data retention characteristic (information holding time). Therefore, .DELTA.t is set in a range having a margin to ensure a data holding operation of each memory cell.

Figure 33:
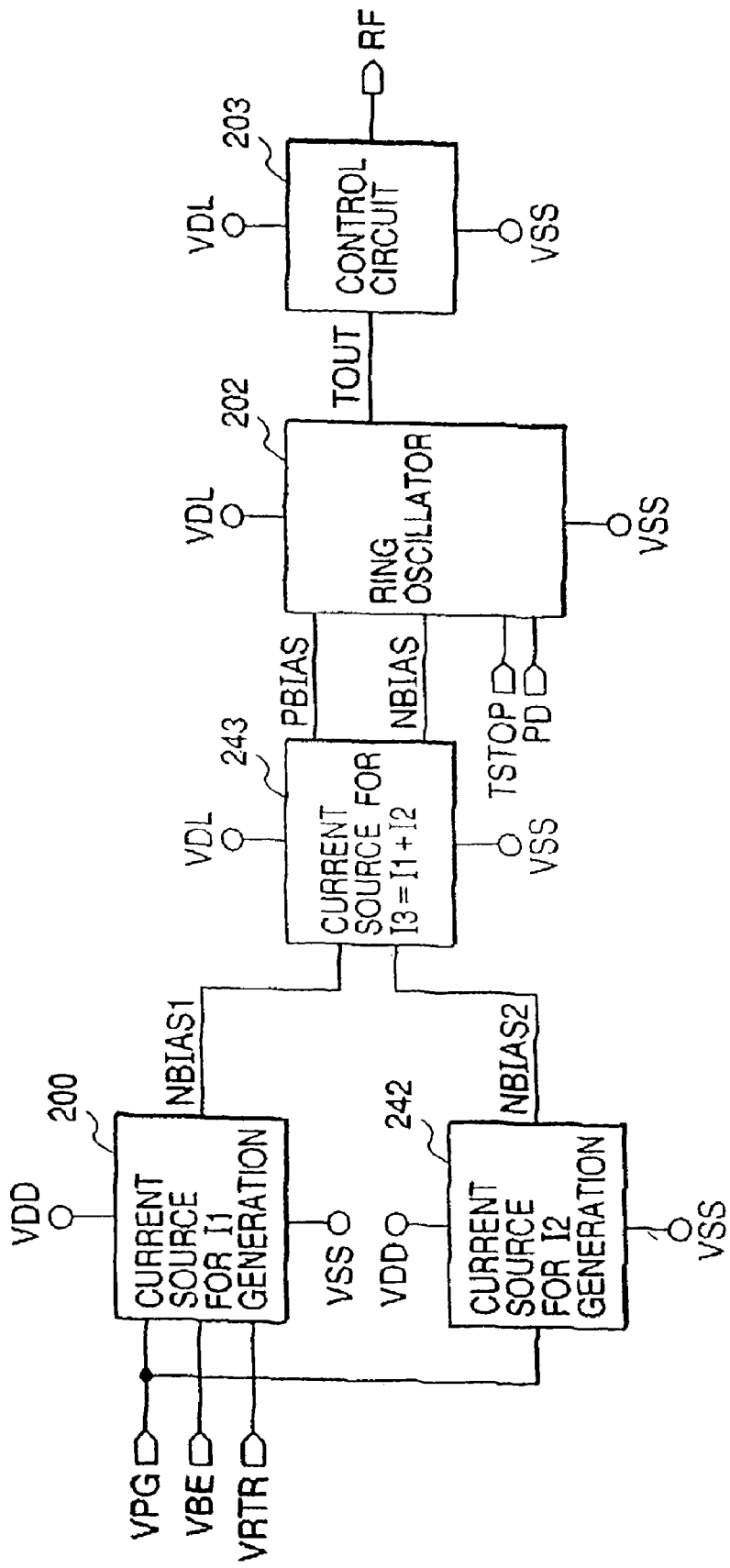
FIG. 33 is a block diagram showing another embodiment of a refresh timer mounted in a DRAM according to the present invention.

A block diagram showing another embodiment of a refresh timer mounted in a DRAM according to the present invention is shown in FIG. 33. The reference numeral 200 is the current source shown in FIG. 29. Reference numeral 242 indicates a current source for generating a current I2 having no temperature dependence. Reference numeral 243 indicates a current source for generating a current I3 by adding the currents I1 and I2. The reference numeral 202 is the ring oscillator shown in FIG. 29. The reference numeral 203 is the control circuit shown in FIG. 29. In the present embodiment, such a contrivance that the above consideration of margin on the extremely-low temperature side is made unnecessary, has been carried out. In the present embodiment, a current source 242 for generating a current I2 is added to the embodiment shown in FIG. 29, and a current source 243 for forming a current I3 (=I1+I2) obtained by adding a current I1 formed by a current source 200 and the current I2 is provided as an alternative to the level converting current source 201. The current source 243 is provided together even with a level converting function for converting a VDD-based current to a VDL reference in a manner similar to the current source 201 shown in FIG. 29. The current source 242 is one for generating the current I2 low in temperature dependence on the current I1 of the current source 200. The present embodiment is similar to the embodiment shown in FIG. 29 in other configuration.

Figure 34:
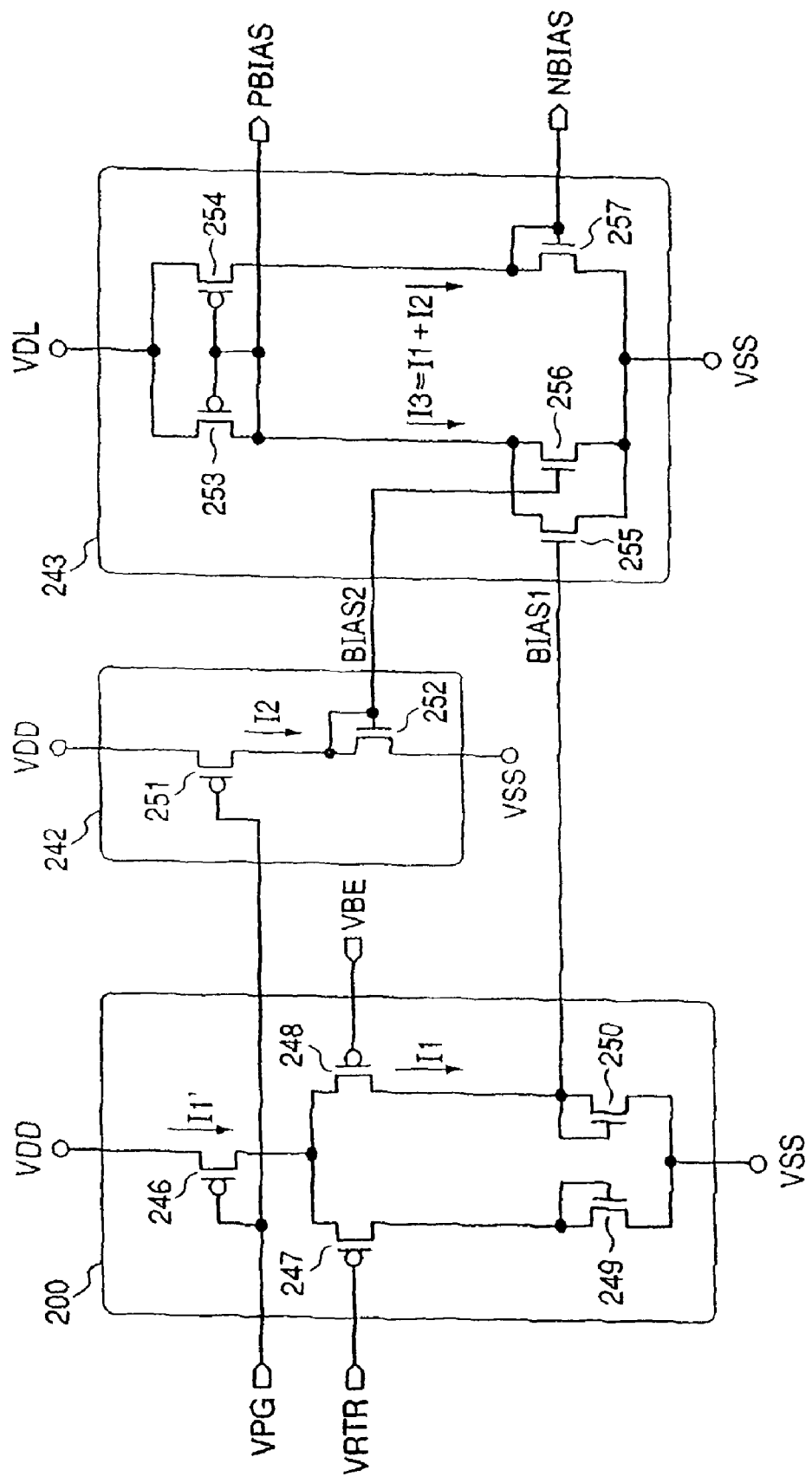
FIG. 34 is a circuit diagram depicting one embodiment illustrative of current sources 200, 242 and 243 shown in FIG. 33.

A circuit diagram depicting one embodiment illustrative of the current sources 200, 242 and 243 shown in FIG. 33 is illustrated in FIG. 34. The reference numerals 246 to 250 are the same as the current sources 204 to 208 shown in FIG. 30. Reference numeral 242 is the same as the current source shown in FIG. 33. The current source 242 includes a P channel MOSFET 251 which is inputted a bias voltage VPG to its gate and an N channel MOSFET 252 whose gate is connected to its drain terminal, and generates a bias voltage BIAS2. Reference numeral 243 indicates a current source for adding the current I1 which is generated by the current source 200 and the current I2 which is generated by the current source 242 and for generating bias voltages NBIAS and PBIAS. In addition to a current source 200 having temperature dependence similar to FIG. 30, a current source 242 is made up of a P channel MOSFET 251 for receiving a constant voltage VPG, and a diode-configured N channel MOSFET 252 to generate a current I2 having no power supply voltage/temperature dependence. The values of the currents I1 and I2 formed by the current sources 200 and 242 are determined according to a constant ratio between the MOSFETs 246 and 251 and the MOSFET 109 shown in FIG. 17.

A bias voltage BIAS1 NBIAS1 corresponding to the current I1 formed by the current source 200, and a bias voltage BIAS2 NBIAS2 corresponding to the current I2 formed by the current source 242 are supplied to their corresponding gates of parallel-configured N channel MOSFETs 255 and 256 that constitute the current source 243. A current I3 obtained by adding the currents I1 and I2 is generated from their common-connected drains of MOSFETs. A current mirror circuit similar to the above, which constitutes the current source 243, forms bias voltages PBIAS and NBIAS each corresponding to the current I3 supplied to the ring oscillator 202.

Figure 35:
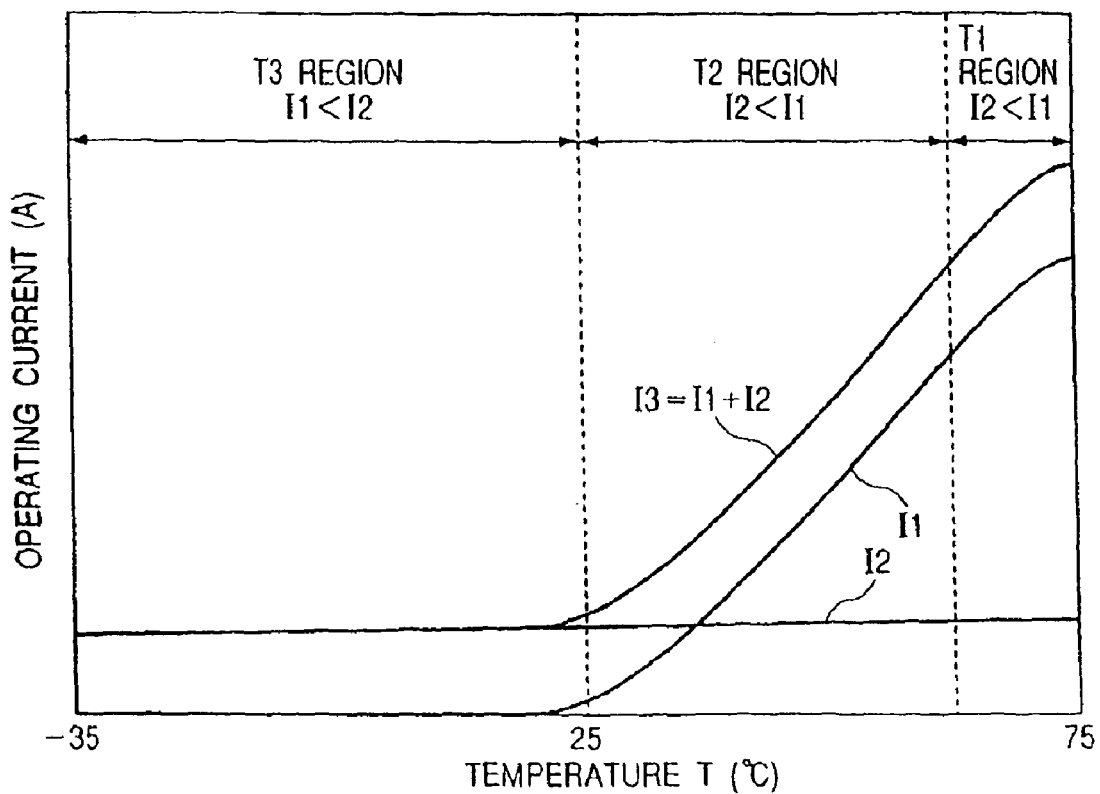
FIG. 35 is a characteristic diagram for describing temperature dependence of each current source shown in FIG. 34.

A characteristic diagram for describing temperature dependence of each current source shown in FIG. 34 is illustrated in FIG. 35. Since the current I1 has temperature dependence as described above, the current I1 decreases with the drop in temperature in temperature T1 and T2 regions shown in the same drawing. Since the current I2 has little temperature dependence, it shows a substantially constant value in all the temperature regions T1, T2 and T3.

If the currents are set so as to take I1>>I2 in the high temperature region T1, then the current I1 having the temperature dependence becomes predominant over the current I3 for determining the cycle of the ring oscillator 202, and the current I3 decreases with the reduction in temperature in the high temperature region T1 and the medium temperature region T2. When the value of the current I1 is lowered with the drop in temperature and reduced to the low temperature region T3 in which the current I2 becomes predominant, the current I3 exhibits a characteristic stable at a constant current in association with the current I2.

Figure 36:
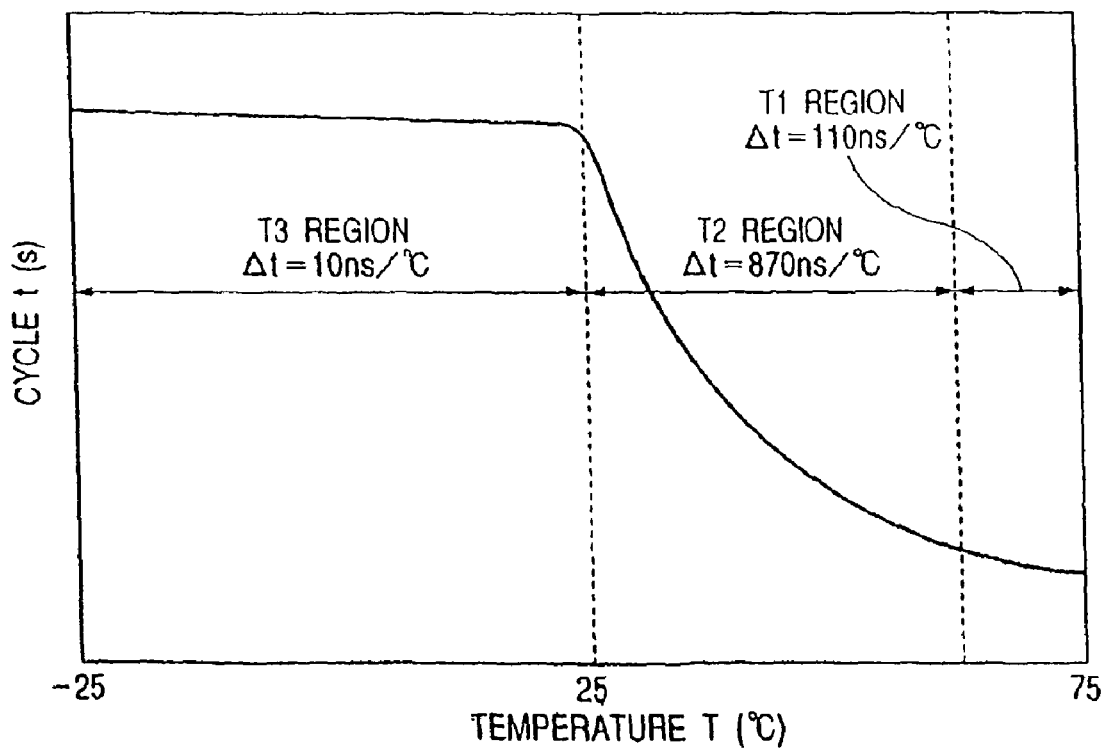
FIG. 36 is a characteristic diagram for describing temperature dependence of the refresh timer shown in FIG. 33.

A characteristic diagram for describing temperature dependence of the refresh timer shown in FIG. 33 is illustrated in FIG. 36. As is apparent even from the characteristic diagram shown in FIG. 35, a refresh cycle t extends with a drop in temperature in high and medium temperature regions T1 and T2 but is saturated in a low temperature region T3. Due to the above characteristic, the refresh cycle is prolonged more than necessary and hence there is no fear of incurring of data damage. While the effect of reducing a refresh current Iref is not brought about in the low temperature region T3, current consumption in this region is as follows. Since a refresh current is reduced and the occupied rate of a DC component is relatively increased, the effect of reducing an at-standby current is not so great even if a refresh operating current changes slightly.

Figure 37:
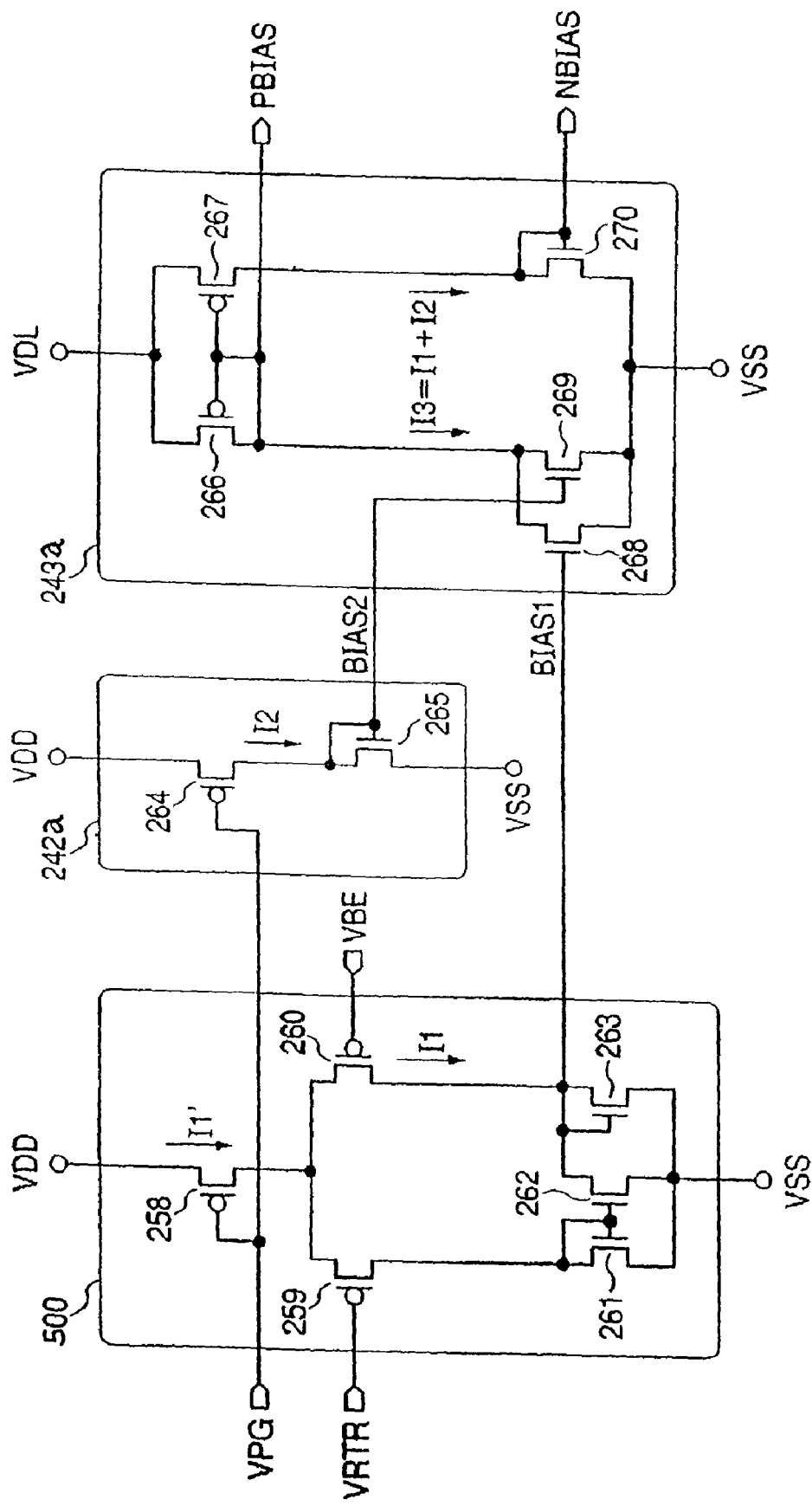
FIG. 37 is a circuit diagram showing another embodiment illustrative of the current sources 200, 242 and 243 shown in FIG. 33.

A circuit diagram showing another embodiment illustrative of the current sources 200, 242 and 243 shown in FIG. 33 is shown in FIG. 37. Reference numeral 500 indicates a current source for generating the current I1 having temperature dependence. The current source 500 includes an N channel MOSFET 262 that is coupled with a MOSFET 263 whose drain and source are coupled to each other. Reference numeral 242a is the current source shown in FIG. 37, and reference numeral 243a is the current source shown in FIG. 37. In the present embodiment, a feedback MOSFET 262 is added to a differential amplifier of the current source 200. The MOSFET 262 has the function of feeding back the amount of change in current on the comparing voltage VRTR side to the VBE side to thereby further increase the amount of change in current I1 with respect to the temperature. Owing to the feedback effect brought about by the MOSFET 262, the amount of change in current increases in the medium temperature region T2 in the characteristic diagram shown in FIG. 35.

Namely, the amount of change in timer cycle due to the temperature can be adjusted by adjusting the constant of the MOSFET 262. Thus, it is possible to adjust temperature dependence of the timer cycle in accordance with a data retention characteristic in the medium temperature region T2. Accordingly, since the refresh cycle at each temperature can be extended to the optimum without incurring data damage, the effect of reducing a refresh current becomes large.

Figure 38:
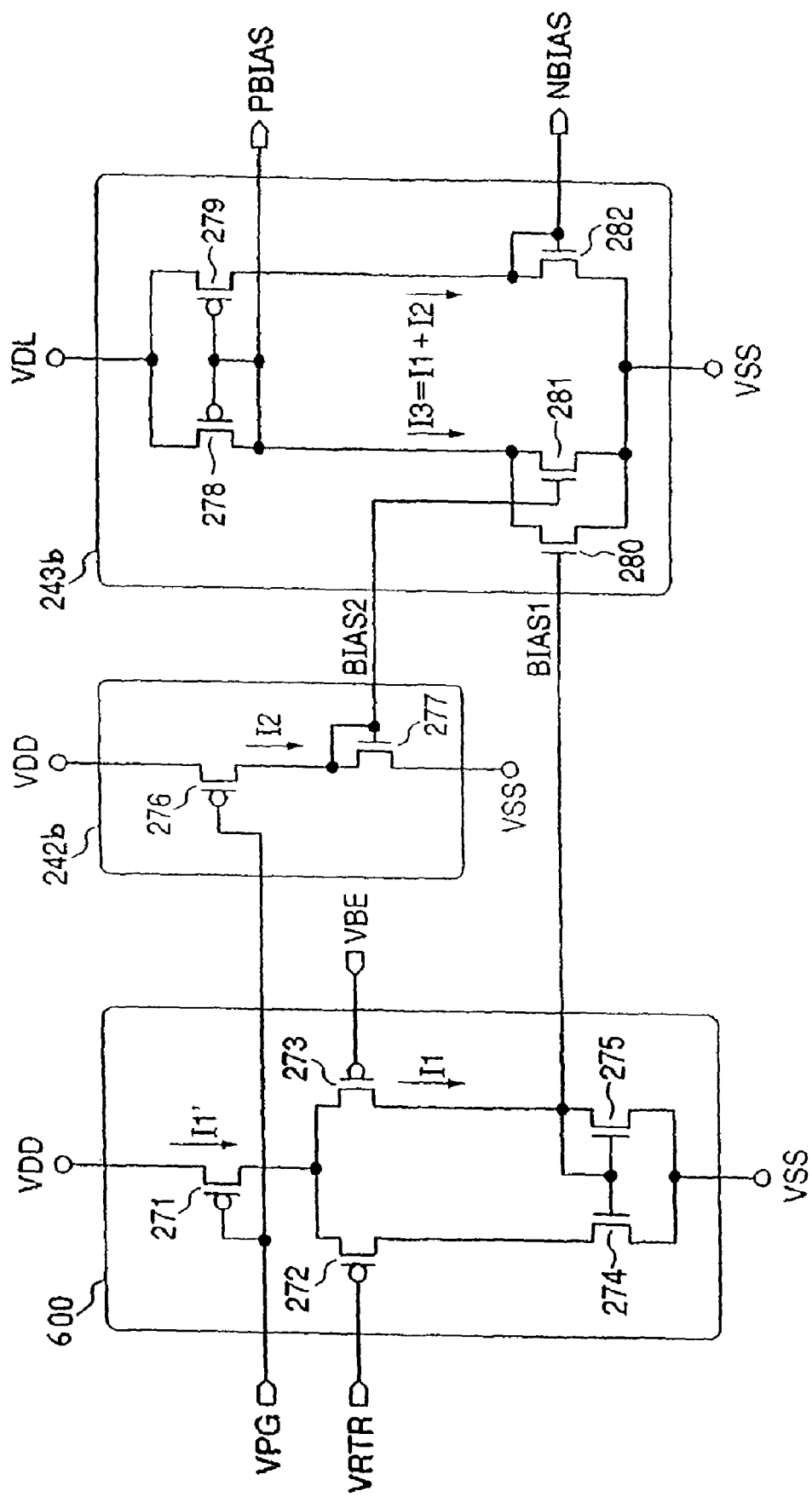
FIG. 38 is a circuit diagram showing a further embodiment illustrative of the current sources 200, 242 and 243 shown in FIG. 33.

A circuit diagram showing a further embodiment illustrative of the current sources 200, 242 and 243 shown in FIG. 33 is shown in FIG. 38. Reference numeral 600 indicates a current source for generating the current I1 having temperature dependence. The current source 600 includes a current mirror formed with N channel MOSFETs 274 and 275 instead of MOSFETs 249 and 250 in the current source 200 shown in FIG. 34. Reference numeral 242b is the current source shown in FIG. 38, and reference numeral 243b is the current source shown in FIG. 38. The present embodiment is one wherein a load on a differential amplifier of the current source 200 is set to a current-mirror type. While the amount of change in current in the medium temperature region T2 is described as a parabola in the characteristic diagram of FIG. 35 in the embodiments shown in FIGS. 34 and 37, the current can be digitally changed at an arbitrary temperature in the present embodiment.

Figure 39:
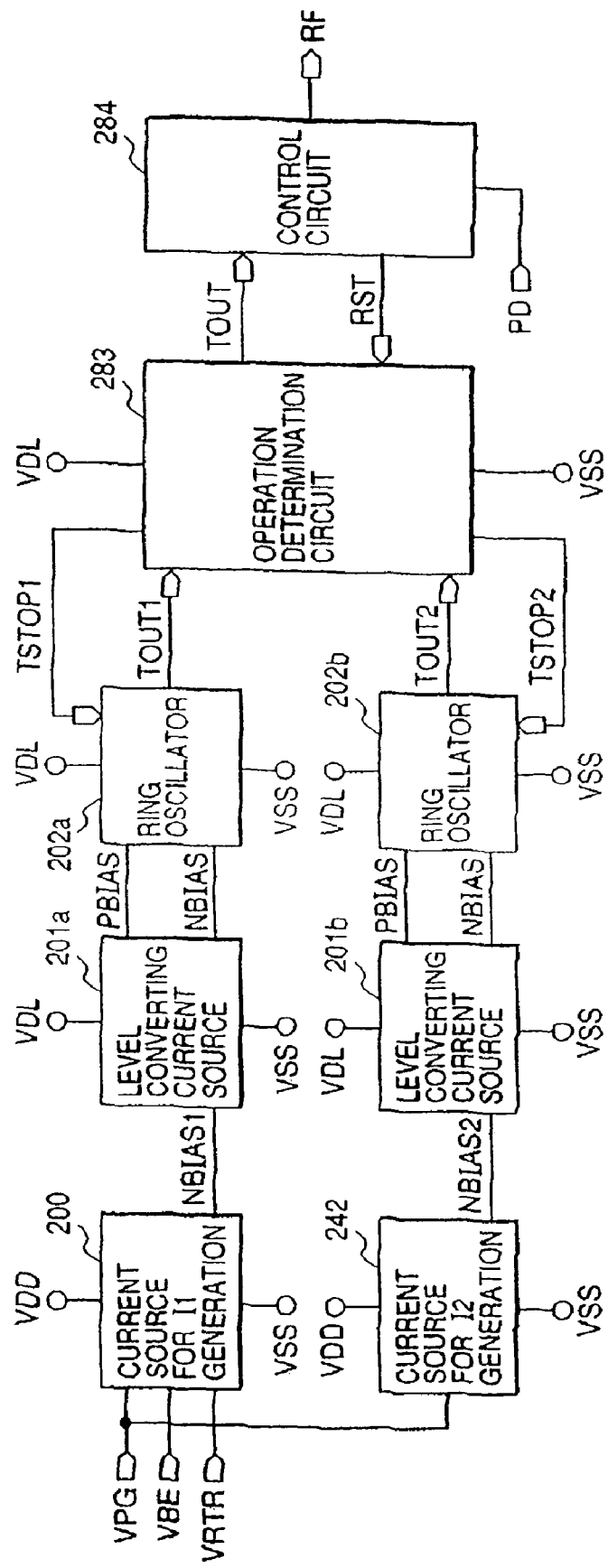
FIG. 39 is a block diagram illustrating a further embodiment of a refresh timer mounted in a DRAM according to the present invention.

A block diagram illustrating a further embodiment of a refresh timer mounted in a DRAM according to the present invention is shown in FIG. 39. Reference numeral 200 is the current source shown in FIG. 33. Reference numeral 242 is the current source shown in FIG. 33. Reference numerals 201a and 201b are similar to the ring oscillator 201 shown in FIG. 29. The current sources 201a and 201b as shown in FIG. 39 are provided in association with these current sources 200 and 242 as shown in FIG. 39. Reference numerals 202a and 202b are similar to the ring oscillator 202 shown in FIG. 29, and ring oscillators 202a and 202b are controlled by bias voltages formed by the level converting current sources 201a and 201b.

Reference numeral 283 indicates a determination circuit for monitoring operating states of the two ring oscillators 202a and 202b, stopping a timer slow in operating speed by one of signals TSTOP1 and TSTOP2, and making effective only one fast in operating speed, of outputs TOUT1 and TOUT2. Reference numeral 284 indicates a control circuit for generating a refresh request signal RF corresponding to the output TOUT of the determination circuit 283.

Figure 40:
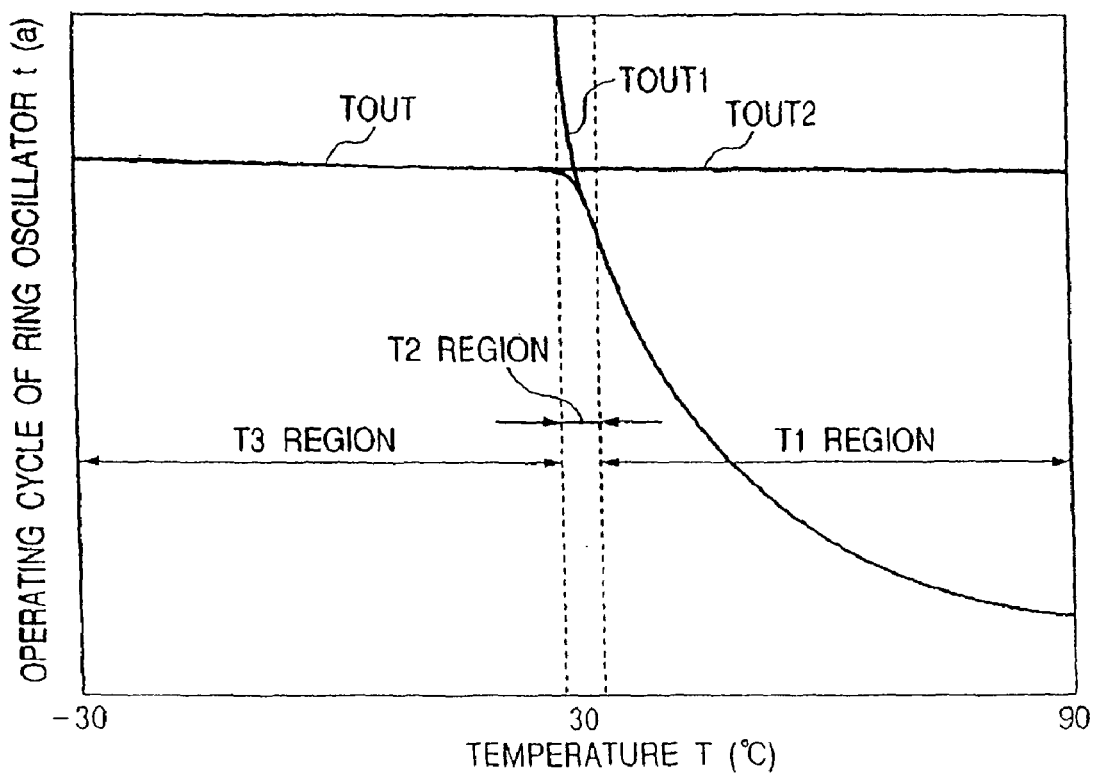
FIG. 40 is a characteristic diagram for describing a refresh operation carried out by the refresh timer shown in FIG. 39.

A characteristic diagram for describing a refresh operation carried out by the refresh timer shown in FIG. 39 is illustrated in FIG. 40. In the present embodiment, the current sources and ring oscillators are identical in configuration to those described up to now. The two ring oscillators 202a and 202b operated by currents I1 and I2 of their current sources are selectively operated. Therefore, the output TOUT1 of the ring oscillator 202a shows a characteristic which extends with a drop in temperature as shown in the same drawing, and the output TOUT2 of the ring oscillator 202b exhibits a substantially constant characteristic without recourse to the temperature.

If a refresh cycle is determined by the output earlier in operating cycle at its corresponding temperature, of the outputs TOUT1 and TOUT2, then the final refresh cycle results in a characteristic indicated by TOUT and thereby becomes substantially similar to one shown in FIG. 36. In the present embodiment, the ring oscillators are provided as two so that a circuit scale is increased correspondingly. On the other hand, the cycles of the ring oscillators 202a and 202b can be set to the optimum in association with temperature regions T1, T2 and T3. In FIG. 40, a temperature range is described up to −30 .degree. C. to +90 .degree. C. The cycle of each ring oscillator can be associated with a refresh characteristic of each memory cell over such a wide temperature range. Incidentally, even in the case of a temperature range of from −25 .degree. C. to +85 .degree. C., it is sufficiently broader than the available temperature range of the conventional DRAM. This falls within the category of the present invention.

Figure 41:
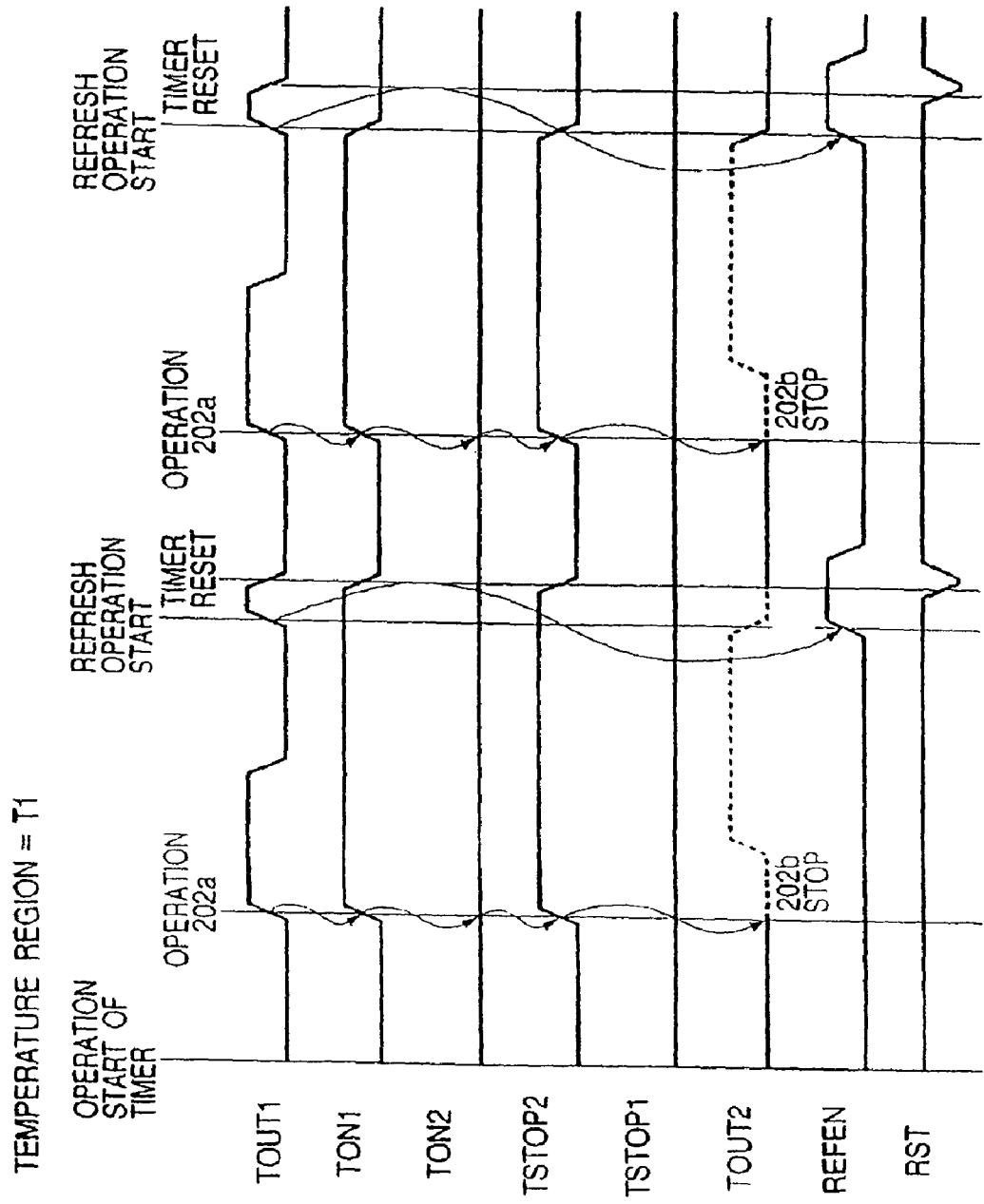
FIG. 41 is a waveform diagram for describing one example of the operation of the refresh timer shown in FIG. 39.

A waveform diagram for describing one example of the operation of the refresh timer shown in FIG. 39 is shown in FIG. 41. The same drawing shows operation waveforms of the refresh timer in the temperature region T1. When the two ring oscillators 202a and 202b are simultaneously started up in the temperature region T1, the output TOUT1 of the ring oscillator 202a fast in operating speed is outputted ahead of the output TOUT2 of the ring oscillator 202b, and a signal TON1 for recognizing that TOUT1 has been outputted, is outputted.

In order to prevent the simultaneous stop of the two ring oscillators and non-execution of the refresh operation, TON2 is monitored to confirm that TOUT2 has not yet been outputted. In this state, TSTOP2 is outputted to stop the ring oscillator 202b. A refresh request signal RF is outputted for each operating cycle of the ring oscillator 202a or in a cycle equal to several times the operating cycle. A reset signal RST is generated from the refresh request signal RF, whereby all the states are cleared. The same operation is repeated subsequently. Since the ring oscillators 202a and 202b are reversed in operating speed in the temperature region T3, the ring oscillator 202a is stopped contrary to the above.

Figure 42:
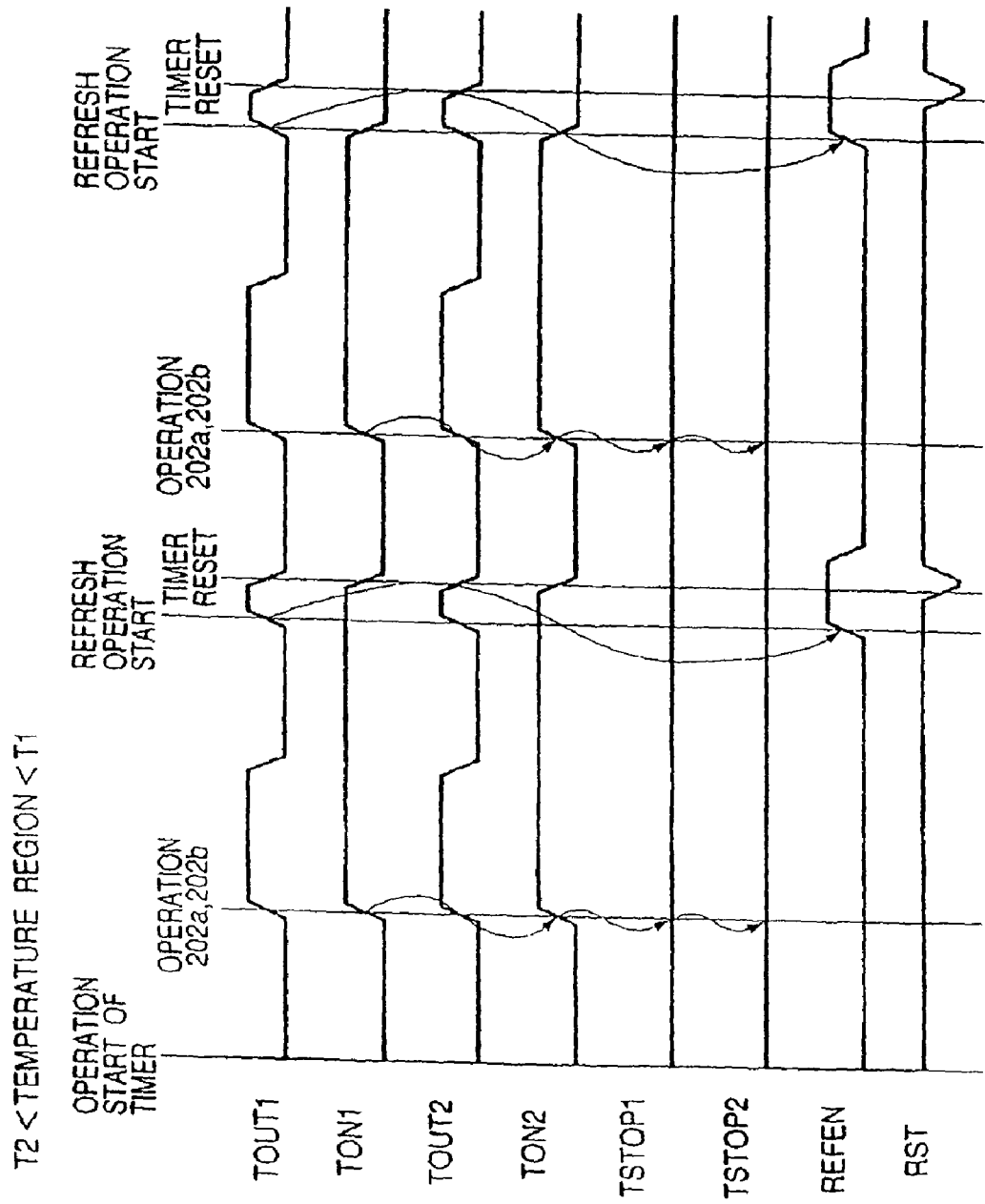
FIG. 42 is a waveform diagram for describing another example of the operation of the refresh timer shown in FIG. 39.

A waveform diagram for describing another example of the operation of the refresh timer shown in FIG. 39 is illustrated in FIG. 42. The same drawing shows operation waveforms of the refresh timer in the temperature region T2. Since the ring oscillators 202a and 202b approach each other in operating speed in the temperature region T2, there is a possibility that TOUT1 and TOUT2 will be outputted simultaneously. Therefore, when their operation recognition signals TON1 and TON2 are both outputted, both the ring oscillators 202a and 202b are prevented from stopping. A refresh request signal RF is outputted by an AND signal of the two TOUT1 and TOUT2.

Figure 43:
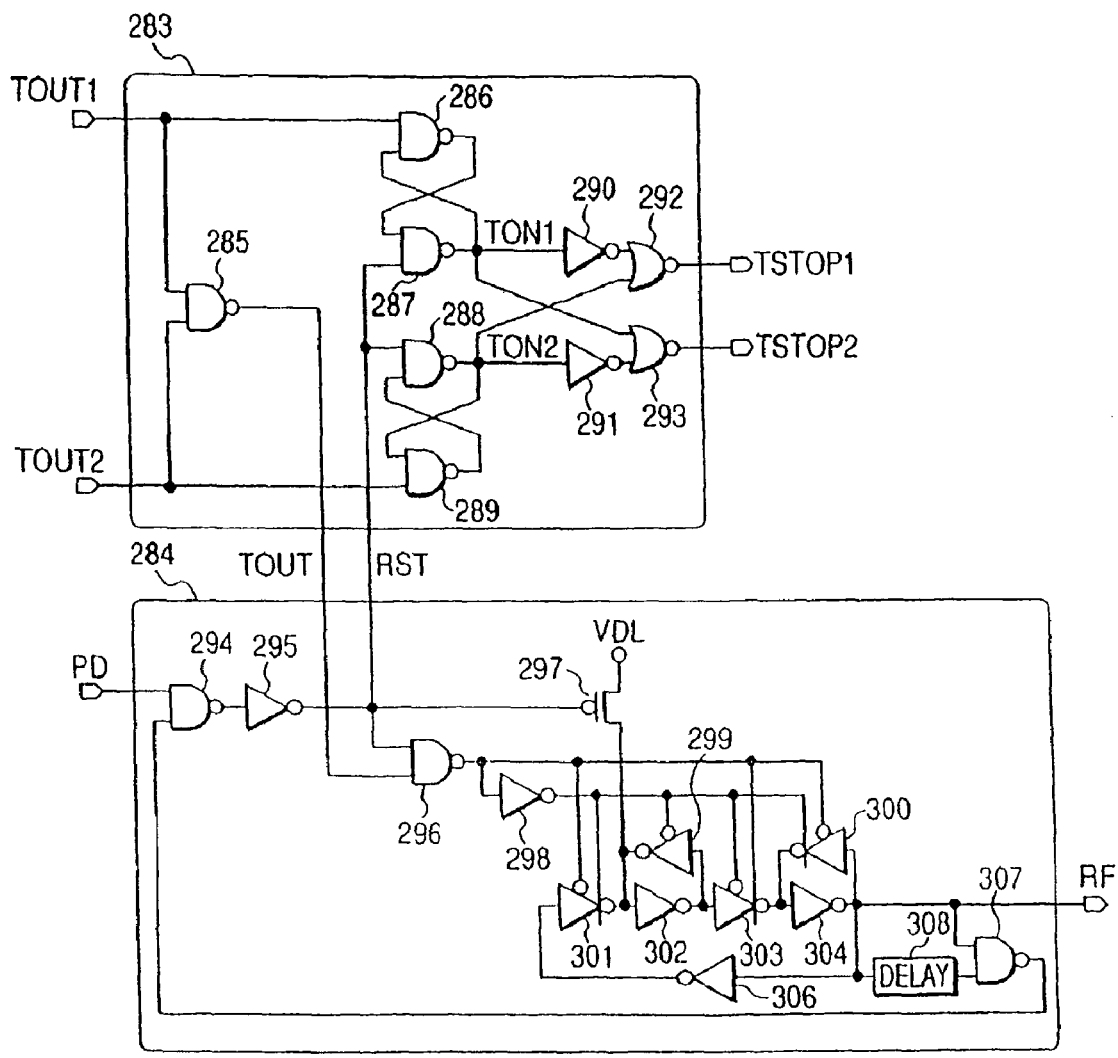
FIG. 43 is a logic circuit diagram showing one embodiment illustrative of an operation determination circuit 283 and a control circuit 284 shown in FIG. 39.

A logic circuit diagram showing one embodiment illustrative of the operation determination circuit 283 and the control circuit 284 shown in FIG. 39 is shown in FIG. 43. Reference numeral 285 indicates a NAND gate for obtaining a NAND signal TOUT of TOUT1 and TOUT2. NAND gate circuits 286 and 287 constitute a latch circuit for recognizing the output of TOUT1 and outputting TON1. NAND gate circuits 288 and 289 constitute a latch circuit for recognizing the output of TOUT2 and outputting TON2.

Reference numeral 292 indicates a NOR gate for monitoring TON1 and TON2 and outputting TSTOP1. Reference numeral 293 indicates a NOR gate for monitoring TON1 and TON2 and outputting TSTOP2. Gate circuits and inverter circuits 296 to 306 constitute a shift register for counting TOUT. A delay circuit 308 and a gate circuit 307 constitute a circuit for generating a one-shot pulse for RST from a refresh request signal RF. Reference numerals 294 and 295 indicate a NAND and an INVERTER gate circuit for generating a one-shot pulse for RST from a power-down signal PD and a one shot signal from the gate circuit 307. Reference numeral 308 indicates a delay circuit for generating a one-shot pulse from the refresh request signal RF.

Figure 44:
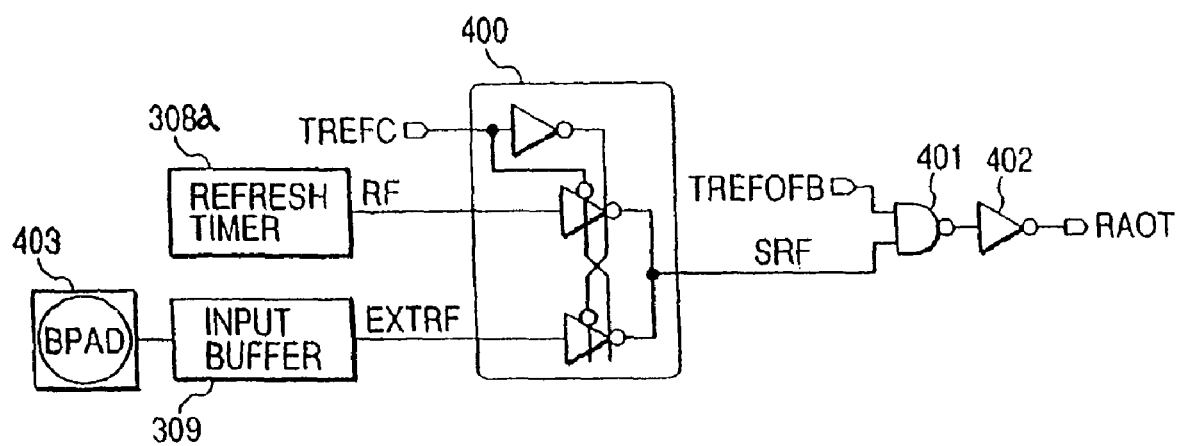
FIG. 44 is a block diagram showing a still further embodiment of a refresh timer according to the present invention.

A block diagram showing a still further embodiment of a refresh timer according to the present invention is shown in FIG. 44. In the present embodiment, a refresh request stop mode is added. Namely, in a memory in which data retention is done with an internal refresh timer, a true characteristic is not obtained because a refresh operation is carried out by the internal refresh timer even upon measuring a data retention characteristic. In the present embodiment, a refresh operation stop signal TREFOFFB is provided so as to avoid the reception of a refresh request signal RF.

In the present embodiment, external control for a refresh operation cycle and a refresh request stop mode function are added. The reference label RAOT indicates a refresh request signal which is selected from the refresh request signal RF generated from a refresh timer 308*a* and an external refresh request signal EXTRF by a selector 400. If the refresh operation can be externally controlled, then current consumption in an arbitrary refresh operation cycle can be recognized. It is also possible to obtain data effective for setting of the characteristic of each refresh timer described up to now. In the memory in which the data retention has been carried out by the internal refresh timer, the refresh operation is done by the internal refresh timer even upon measuring the data retention characteristic. Therefore, a mode for stopping a refresh request is required.

In order to cause the refresh timer to have such a function as described above, the following circuits are added to a refresh timer 308*a*. Reference-numeral 403 indicates a bonding pad for inputting a refresh request signal from outside. Reference numeral 309 indicates an input buffer for taking in or capturing a refresh request signal inputted from the bonding pad 403. Designated at numeral 308*a* is such a refresh timer as described above. Reference numeral 400 indicates a selector for selecting a signal RF outputted from the refresh timer 308*a* and a signal EXTRF outputted from the input buffer 309 in response to a select signal TREFC.

Reference numeral 401 indicates a NAND gate for invalidating an output SRF of the selector 400 in response to a signal TREFB and stopping a refresh startup signal RACT. The bonding pad 403 may share the use of a pad used in a normal operation, such as a dedicated pad or an address pin or the like. The signals TREFC and TREFOFB are generated according to a test mode or inputted from outside through a dedicated pad.

Operations and effects obtained from the above-described embodiments are as follows:

(1) An advantageous effect is obtained in that semiconductor memory circuit can be obtained which includes an internal circuit capable of selectively stopping the supply and stop of an operating voltage via switch means and wherein the supply and stop of the operating voltage by the switch means are controlled by an input circuit having a predetermined control signal therein to thereby realize a reduction in power consumption by virtue of a reduction of a DC current and a leak current when no memory operation is done.

(2) In addition to the above, an advantageous effect is obtained in that an output circuit for forming an output signal in response to a signal outputted from the memory array is operated on a steady basis by the operating voltage, and the input circuit brings the output circuit to an output high impedance state when the switch means is brought to an off state to stop the supply of the operating voltage to the internal circuit, whereby the semiconductor memory circuit is connected to other circuit blocks and a common bus, thereby making it possible to bring only the semiconductor memory circuit to the low power consumption mode.

(3) In addition to the above, an advantageous effect is obtained in that the memory array comprises memory cells each of which needs a periodic or cyclic refresh operation for holding memory information, whereby a reduction in power consumption can be realized while a great increase in storage capacity and high integration are being achieved.

(4) In addition to the above, an advantageous effect is obtained in that the internal circuit is provided with an operation voltage generating circuit for supplying an operating voltage to an address selection circuit for performing the operation of selecting each memory cell, and the operation voltage generating circuit performs the supply and stop of an operating voltage supplied from an external terminal via the switch means, whereby the switching between the supply of an operating voltage to the internal circuit and its stop can be done in a simple circuit configuration.

(5) In addition to the above, an advantageous effect is obtained in that a semiconductor memory circuit is adopted which includes a time multimode for, when a memory operation for reading or writing memory information from and to each of the memory cells and a refresh operation based on addressing different from that at the memory operation compete with each other on a time basis, executing a time multimode for executing the refresh operation before or after such a memory operation, and an interface is associated with a static RAM, whereby a semiconductor memory circuit having mass storage capacity comparable to a dynamic RAM can be implemented while realizing low power consumption and an easy-to-use memory operation comparable to the static RAM.

(6) An advantageous effect is obtained in that in a semiconductor memory circuit including memory cells each of which needs a periodic or cyclic refresh operation for holding memory information, the cycle of the refresh operation is changed according to temperature dependence of an information holding time of each memory cell to thereby make it possible to greatly reduce current consumption necessary for the refresh operation.

(7) In addition to the above, an advantageous effect is obtained in that a first temperature region in which the cycle is changed according to an information holding time of each memory cell on the high temperature side in which a refresh cycle is relatively shortened, and a second temperature region in which the cycle is set to a substantially constant cycle shorter than an information holding time of each memory cell on the low temperature side in which a refresh cycle is relatively made long, are provided, whereby current consumption necessary for the refresh operation can be significantly reduced while a data holding characteristic in a low temperature region is being maintained.

(8) In addition to the above, an advantageous effect is obtained in that when a memory operation for reading or writing memory information from and to each of the memory cells and a refresh operation based on addressing different from that at the memory operation compete with each other on a time basis, a time multimode for executing the refresh operation before or after such a memory operation is set, and an interface circuit corresponding to a static RAM is provided, whereby a semiconductor memory circuit having mass storage capacity comparable to a dynamic RAM can be realized while implementing low power consumption and a memory operation replaceable by the static RAM.

(9) In addition to the above, an advantageous effect is obtained in that the refresh operation is controlled by a timer circuit using the cycle of an oscillator circuit operated by a current obtained by combining a first current having temperature dependence corresponding to the first temperature region and a constant current corresponding to the second temperature region, whereby current consumption necessary for the refresh operation can be significantly reduced while maintaining a data holding characteristic in a low temperature region.

(10) An advantageous effect is obtained in that as a timer circuit for controlling the refresh operation, a first oscillator circuit operated by a first current having temperature dependence corresponding to a first temperature region, and a second oscillator circuit operated by a constant current corresponding to the second temperature region are provided, and the timer circuit comprises an output selection circuit for forming the refresh control signal according to a short one of oscillation outputs of the first oscillation circuit and the second oscillation circuit, whereby current consumption necessary for the refresh operation can be significantly reduced while maintaining a data holding characteristic in a low temperature region.

(11) In addition to the above, an advantageous effect is obtained in that the operation of the timer circuit is invalidated so that the information holding time of each memory cell is capable of being measured according to the memory operation, whereby a true characteristic can be evaluated upon an analysis of AC and DC current components of an at-standby current in a cut and divided state, an analysis intended for a further current consumption reduction with the extension of a refresh cycle, and evaluation of a data retention characteristic.

While the invention made above by the present inventors has been described specifically by the illustrated embodiments, the invention of the present application is not limited to the embodiments. It is needless to say that various changes can be made thereto within the scope not departing from the substance thereof. For example, as a memory array, may be used one wherein it is divided into plural form in bit line and word line directions and a plurality of address selection circuits are provided in association with such divided memory cell arrays. As word lines and bit lines, may be ones which adopt a hierarchical word line system, like main and local word lines. The bit lines may also adopt a hierarchical bit line system, like local and main bit lines or the like.

The memory cell arrays and the address selection circuits can be configured by using the device structure and circuit layout technology employed in the dynamic RAM known to date. As in this embodiment, a synchronous pseudo SRAM having a refresh concealment+page mode, and a refresh concealment+DRAM interface (address multi and RAS/CAS control) can also be configured.

With high functioning of electronic apparatus like a cellular telephone or the like, there has been increasingly a demand for a large-capacity work RAM. While the work RAM is normally fabricated as an asynchronous SRAM, it is not suited for an increase in capacity. While attention has been given to a large-capacity DRAM as its alternative memory, it needs refresh and has poor usability. A semiconductor memory device according to the present invention is capable of holding compatibility with the asynchronous SRAM and is formed integrally with a flash memory. Thus, the semiconductor memory device can exhibit various memory operations according to a combination with the flash memory having a non-volatile information function at power-off.

Even in a non-volatile memory like a flash memory or the like in addition to the DRAM like the pseudo SRAM, pseudo synchronous SRAM or the like that needs the refresh operation described above, such a circuit made up of MOSFETs each having a low threshold voltage that an operating current always continues to flow by a charge pump circuit or a leak current produced by each MOSFET is innegligible, increases in current consumption upon its non-operation. Therefore, a semiconductor memory circuit can be brought to low power consumption by the application of the present invention thereto.

Before the transition to the DPD mode, only the refresh operation may be stopped by the timer circuit for a predetermined period. Namely, the refresh timer 14 is deactivated by the CS2 signal as a first stage. This is defined as a first mode for reducing the refresh operating current shown in FIG. 25. The timer circuit determines that the first mode has continued for a predetermined period, and the mode may be transitioned to the DPD mode for reducing the MOS off current and power supply circuit DC current. Since the refresh operation has simply stopped during a period of the first mode in this configuration, the stored data is damaged but a write operation can be performed immediately. It is thus possible to ensure high response.

The present invention can be widely used in ones multi-chip-configured as in the embodiments in addition to a single memory device or the like, or various semiconductor memory circuits including a semiconductor memory circuit formed in a semiconductor integrated circuit device like a system LSI equipped with a CPU, a RAM, a DRAM, etc.

Advantageous effects obtained by a typical one of the inventions disclosed in the present application will be described in brief as follows. A semiconductor memory circuit can be obtained wherein an internal circuit is provided which is capable of selectively the supply and stop of an operating voltage via switch means, and includes a memory array, and an input circuit receiving a predetermined control signal therein controls the supply and stop of the operating voltage by the switch means, whereby low power consumption is realized by a reduction of a DC current and a leak current when no memory operation is performed.

What is claimed is:
1. A semiconductor memory circuit comprising:
a first terminal which receives a first control signal;
a second terminal which receives a second control signal;
a third terminal;
a power source terminal which receives a power source voltage;
a first input circuit which is coupled to the first terminal and which outputs a first internal signal;
a second input circuit which is coupled to the second terminal and the power source terminal and which outputs a second internal signal;

a processing circuit which includes a DRAM circuit and which outputs a data signal in response to the first internal signal;

an output circuit which receives the data signal and outputs an output signal to the third terminal; and a power supply unit which is coupled to the power source terminal and the processing circuit, wherein when the second control signal is in a first level, the power supply unit stops supplying an internal voltage to the processing circuit, and when the second control signal is in a second level different from the first level, the power supply unit supplies the internal voltage to the processing circuit, wherein when the second control signal is in the first level, the output circuit is in an output high impedance state in accordance with the second internal signal.

2. A semiconductor memory circuit according to claim 1, wherein when the second control signal in the first level, the second control signal instructs a low power consumption mode.

3. A semiconductor memory circuit according to claim 1, wherein the DRAM circuit comprises:

a memory array comprising a plurality of word lines and a plurality of data lines;

a plurality of DRAM cells respectively connected to the plurality of word lines and the plurality of data lines; and a word line drive circuit connected to the plurality of word lines, wherein the internal voltage is a voltage for driving the word line drive circuit.

* * * * *